(12) United States Patent  
Higuchi et al.

(10) Patent No.: US 12,494,763 B2
(45) Date of Patent: Dec. 9, 2025

(54) RESONANCE DEVICE

(71) Applicant: Murata Manufacturing Co., Ltd., Nagaokakyo (JP)

(72) Inventors: Yoshiyuki Higuchi, Nagaokakyo (JP); Masakazu Fukumitsu, Nagaokakyo (JP); Fumiya Endo, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/958,435

(22) Filed: Nov. 25, 2024

(65) Prior Publication Data

US 2025/0112614 A1 Apr. 3, 2025

Related U.S. Application Data

(63) Continuation of application No. PCT/JP2023/006948, filed on Feb. 27, 2023.

(30) Foreign Application Priority Data

Jul. 5, 2022 (JP) ................. 2022-108197

(51) Int. Cl.
*H03H 9/02* (2006.01)
*H03H 9/10* (2006.01)
*H03H 9/13* (2006.01)

(52) U.S. Cl.
CPC .... *H03H 9/02433* (2013.01); *H03H 9/02259* (2013.01); *H03H 9/1057* (2013.01); *H03H 9/131* (2013.01)

(58) Field of Classification Search
CPC ........... H03H 9/02433; H03H 9/02259; H03H 9/1057; H03H 9/131; H03H 9/0595; H03H 9/1035; H03H 9/2489; H03H 9/24
See application file for complete search history.

(56) References Cited

U.S. PATENT DOCUMENTS

| 10,673,408 | B2* | 6/2020 | Goto ..................... B06B 1/0603 |
| 2022/0029598 | A1* | 1/2022 | Inoue .................. H03H 9/0595 |
| 2023/0283257 | A1 | 9/2023 | Kawai et al. |

FOREIGN PATENT DOCUMENTS

| JP | H0681132 U | 11/1994 |
| JP | 2015-106634 A | 6/2015 |

(Continued)

OTHER PUBLICATIONS

International Search Report received for PCT Patent Application No. PCT/JP2023/006948, mailed on May 16, 2023, 2 pages (English Translation Only).

*Primary Examiner* — Jeffrey M Shin
(74) *Attorney, Agent, or Firm* — ArentFox Schiff LLP

(57) ABSTRACT

A resonance device includes a resonator including a vibration part, a frame disposed at at least a part of a circumference of the vibration part, and a supporting arm connecting the vibration part to the frame; and a first substrate including a first bottom plate configured to have a first gap from o the vibration part in a thickness direction, a first side wall, and a first limiting part having a first distance to the resonator in the thickness direction smaller than a second distance between the resonator and the first bottom plate. The first limiting part includes a first tip-end with a first metal film facing the resonator in the thickness direction. The first metal film is configured as a first getter that maintains a vacuum of a vibration space in the resonance device.

20 Claims, 14 Drawing Sheets

(56) References Cited

FOREIGN PATENT DOCUMENTS

WO  2020/261630 A1  12/2020
WO  2022/130676 A1  6/2022

\* cited by examiner

RESONANCE DEVICE

CROSS REFERENCE TO RELATED APPLICATIONS

This application is a continuation of International Application No. PCT/JP2023/006948, filed Feb. 27, 2023, which claims priority to Japanese Patent Application No. 2022-108197, filed Jul. 5, 2022, the entire contents of each of which are hereby incorporated by reference in their entireties.

TECHNICAL FIELD

The present disclosure relates to a resonance device.

BACKGROUND

In various electronic devices (for example, a mobile communication terminal, a communication base station, and a home appliance), resonance devices are used for various uses, such as a timing device, a sensor, and an oscillator. As one type of these resonance devices, a so-called micro electro mechanical systems (MEMS) resonance device including a lower cover, an upper cover, and a resonator is known. The upper cover forms a vibration space between the lower cover and the upper cover. The resonator includes a vibration arm held in the vibration space in a vibratable manner.

For example, International Publication No. 2020-261630 discloses a resonance device including a resonator, a lower cover, and an upper cover. The lower cover includes a limiting part provided in such a manner as to have a first distance from a supporting arm of the resonator in a thickness direction. The limiting part includes a step forming height difference with respect to a bottom surface of a recess part of the lower cover. A maximum amplitude of the supporting arm in the thickness direction is limited to the first distance.

However, in the resonance device described in International Publication No. 2020-261630, at least one of the supporting arm and the limiting part can be scraped when a collision occurs between the supporting arm and the limiting part, and fine particles caused as a result can be scattered to cause frequency fluctuation.

SUMMARY OF THE INVENTION

In view of the foregoing, some exemplary aspects of the present disclosure provide a resonance device configured to suppress frequency fluctuation.

In an exemplary aspect, a resonance device is provided that includes: a resonator including a vibration part, a holding part disposed at at least a part of a circumference of the vibration part, and a supporting arm connecting the vibration part and the holding part; and a first substrate including a first bottom plate configured to have a first gap relative to the vibration part in a thickness direction, a first side wall extending from a circumferential edge part of the first bottom plate toward the holding part, and a first limiting part having a first distance to the resonator in the thickness direction smaller than a second distance between the resonator and the first bottom plate. The first limiting part is configured to have a first tip-end part with a first metal film facing the resonator in the thickness direction. The first metal film is configured as a first getter that maintains a vacuum of a vibration space in the resonance device.

Some exemplary aspects of the present disclosure provide a resonance device that can suppress frequency fluctuation.

DETAILED DESCRIPTION OF EXEMPLARY EMBODIMENTS

Hereinafter, exemplary embodiments of the present disclosure are described with reference to the drawings. The drawings of the present exemplary embodiments are merely illustration, where the dimensions and shapes of respective parts are schematic, and thereby the technical scope of the disclosure of the present application should not be interpreted as being limited to the exemplary embodiments.

First Exemplary Embodiment

Figure 1:
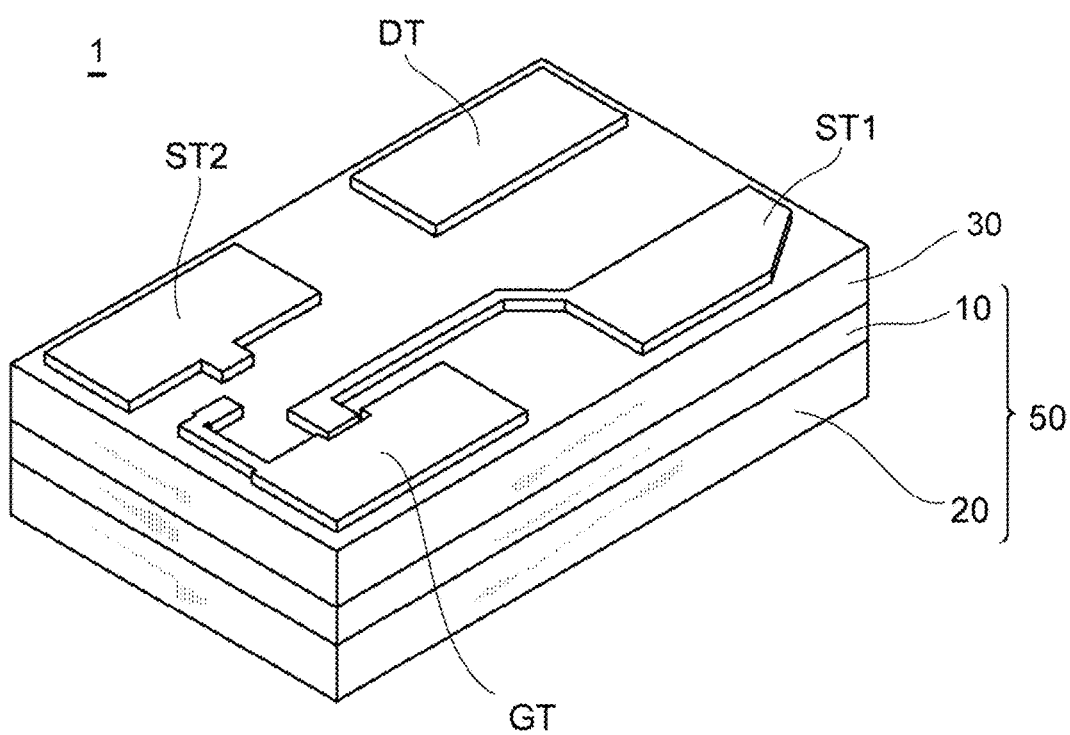
FIG. 1 is a perspective view of a resonance device according to a first exemplary embodiment.
Figure 2:
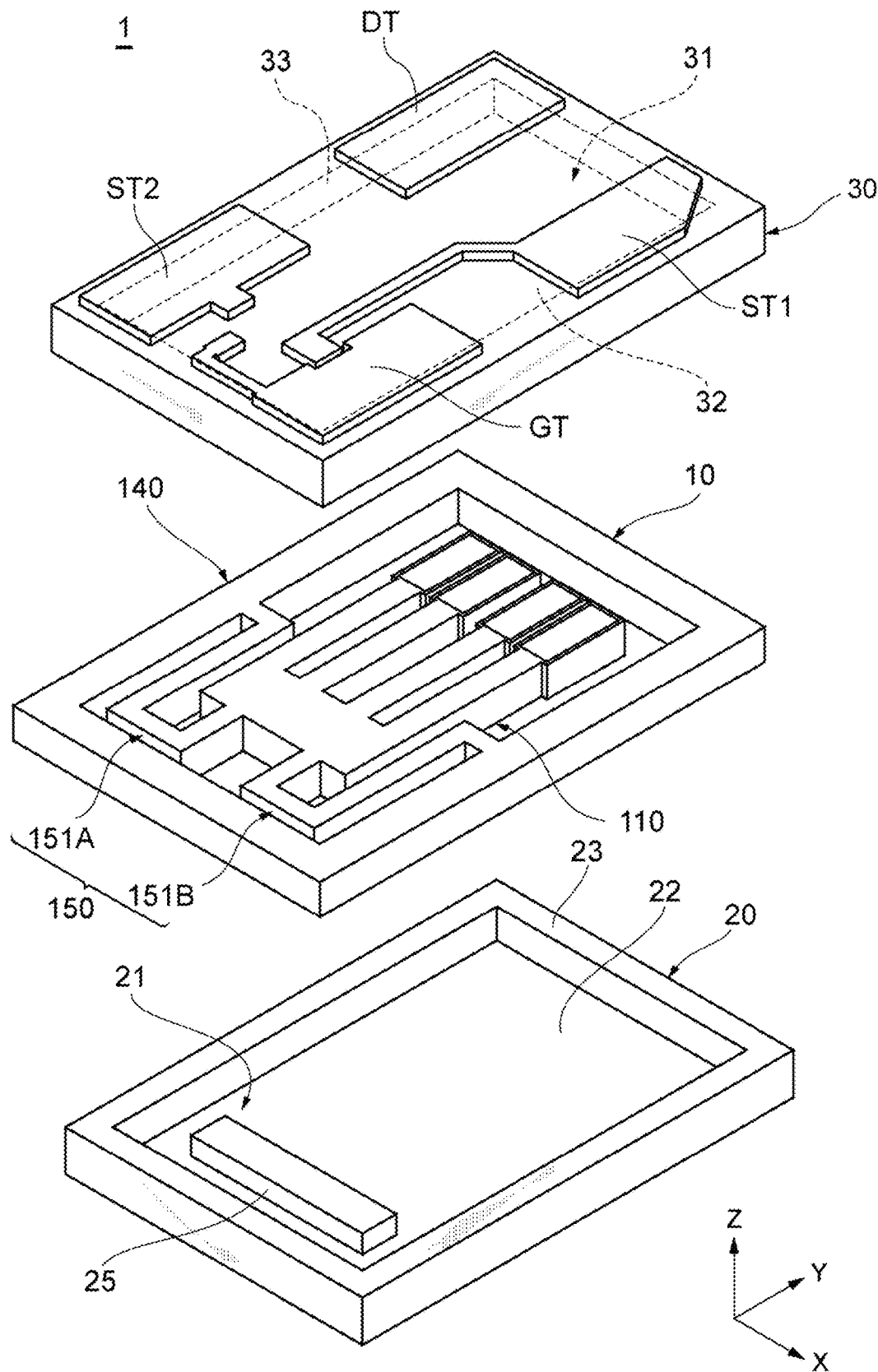
FIG. 2 is an exploded perspective view of the resonance device according to the first exemplary embodiment.

First, a schematic configuration of a resonance device 1 according to a first exemplary embodiment of the present disclosure is described with reference to FIGS. 1 and 2. FIG. 1 is a perspective view of the resonance device according to the first exemplary embodiment. FIG. 2 is an exploded perspective view of the resonance device according to the first exemplary embodiment.

Each configuration of the resonance device 1 is described below. In each drawing, the orthogonal coordinate system formed by the X-axis, the Y-axis, and the Z-axis can be given for the sake of convenience to clarify the mutual relationship between the drawings and to facilitate understanding on the positional relationship between the respective components. Respective directions in parallel to the X-axis, the Y-axis, and the Z-axis are referred to as an X-axis direction, a Y-axis direction, and a Z-axis direction. A plane defined by the X-axis and the Y-axis is referred to as an XY plane, and the same holds for a YZ plane and a ZX plane.

As shown in the exemplary aspect, the resonance device 1 includes a resonator 10, and a lower cover 20 and an upper cover 30 opposed to one another while sandwiching the resonator 10 therebetween. The lower cover 20, the resonator 10, and the upper cover 30 are stacked in this order in the Z-axis direction. For purposes of this disclosure, it is noted that the Z-axis direction in which the lower cover 20, the resonator 10, and the upper cover 30 are stacked is referred to below as a "thickness direction". The resonator 10 and the lower cover 20 are joined one another to form a MEMS substrate 50. The upper cover 30 is joined to the resonator 10 of the MEMS substrate 50. In other words, the upper cover 30 is joined to the lower cover 20 with the resonator 10 interposed therebetween. The lower cover 20 and the upper cover 30 form a package structure that internally forms a vibration space where the resonator 10 vibrates. One of the lower cover 20 and the upper cover 30 corresponds to one example of a first substrate, and the other one of the lower cover 20 and the upper cover 30 corresponds to one example of a second substrate.

According to an exemplary aspect, the resonator 10 is a MEMS vibration element that is manufactured by using a MEMS technology. A frequency band of the resonator 10 is, for example, 1 kHz or more and 1 MHz or less. The resonator 10 includes a vibration part 110, a holding part 140 (e.g., a frame), and a supporting arm 150.

The vibration part 110 is held in a vibratable manner in the vibration space that is provided between the lower cover 20 and the upper cover 30. The vibration part 110 extends along the XY plane in a non-vibrating state where no voltage is applied, and bending-vibrates in the Z-axis direction in a vibrating state where voltage is applied. That is, in operation, a vibration mode of the vibration part 110 is an out-of-plane bending vibration mode. However, the vibration part 110 in the non-vibrating state can bend in the Z direction due to its own weight.

It is noted that the vibration mode of the vibration part is not limited to the out-of-plane bending vibration mode. For example, the vibration mode of the vibration part can be an in-plane bending vibration mode, or can be a thickness-shear vibration mode in alternative aspects.

For example, the holding part 140 (e.g., a frame) is provided in a frame shape so as to surround the vibration part 110 when the XY plane is seen in plan view (hereinafter, simply be referred to as "in plan view"). The holding part 140 forms, together with the lower cover 20 and the upper cover 30, the vibration space of the package structure. Note that the holding part 140 is not limited to have the frame shape as long as it is provided to at least a part of the circumference of the vibration part 110.

The supporting arm 150 is provided between the vibration part 110 and the holding part 140 when seen in plan view. The supporting arm 150 connects the vibration part 110 and the holding part 140.

The lower cover 20 includes a bottom plate 22 and a side wall 23. The bottom plate 22 is provided in such a manner as to have a gap with respect to the vibration part 110 in the thickness direction. The bottom plate 22 is a plate-shaped portion having a principal surface extending along the XY plane. The side wall 23 extends from a circumferential edge part of the bottom plate 22 toward the upper cover 30. The side wall 23 is a frame-shaped portion surrounding the vibration part 110 when seen in a plan view. Moreover, the side wall 23 is joined to the holding part 140 of the resonator 10. In the lower cover 20, a cavity 21 surrounded by the bottom plate 22 and the side wall 23 is formed at a side facing the vibration part 110 of the resonator 10. The cavity 21 is a cavity having a rectangular parallelepiped shape that opens upward.

The lower cover 20 further includes a limiting part 25 that is brought in contact with a part of the vibration part 110 and the supporting arm 150 when impact such as falling is applied to the r resonance device 1, thereby limiting displacement of the vibration part 110 and the supporting arm 150 toward the lower cover 20. A detailed configuration of the limiting part 25 will be described later.

The upper cover 30 includes a bottom plate 32 and a side wall 33. The bottom plate 32 is provided in such a manner as to have a gap with respect to the vibration part 110 in the thickness direction. The bottom plate 32 is a plate-shaped portion having a principal surface extending along the XY plane. The side wall 33 extends from a circumferential edge part of the bottom plate 32 toward the lower cover 20. The side wall 33 is a frame-shaped portion surrounding the vibration part 110 when seen in plan view. The side wall 33 is joined to the holding part 140 of the resonator 10. In the upper cover 30, a cavity 31 surrounded by the bottom plate 32 and the side wall 33 is formed at a side facing the vibration part 110 of the resonator 10. The cavity 31 is a cavity having a rectangular parallelepiped shape that opens upward. The cavity 21 and the cavity 31 face one another while sandwiching the vibration part 110 of the resonator 10 therebetween, and form the vibration space of the resonator 10.

The upper cover 30 further includes a limiting part 35. Similarly to the limiting part 25, the limiting part 35 is brought in contact with a part of the vibration part 110 and the supporting arm 150, thereby limiting displacement of the vibration part 110 and the supporting arm 150 toward the upper cover 30. A detailed configuration of the limiting part 35 will be described later.

The upper cover 30 is provided with, at its upper surface, two power terminals ST1 and ST2, a ground terminal GT, and a dummy terminal DT. For purposes of this disclosure and according to an exemplary aspect, the power terminals ST1 and ST2, the ground terminal GT, and the dummy terminal DT are collectively referred to below as an "outer terminal". Each of the power terminals ST1 and ST2 applies a drive signal (drive voltage) to the resonator 10. Each of the power terminals ST1 and ST2 is electrically connected to a metal film E2 that corresponds to an upper electrode of the resonator 10, which will be described later. The ground terminal GT applies a reference potential to the resonator 10. The ground terminal GT is electrically connected to a metal film E1 that corresponds to a lower electrode of the resonator 10, which will be described later. The dummy terminal DT is not electrically connected to the resonator 10 in the exemplary aspect.

Figure 3:
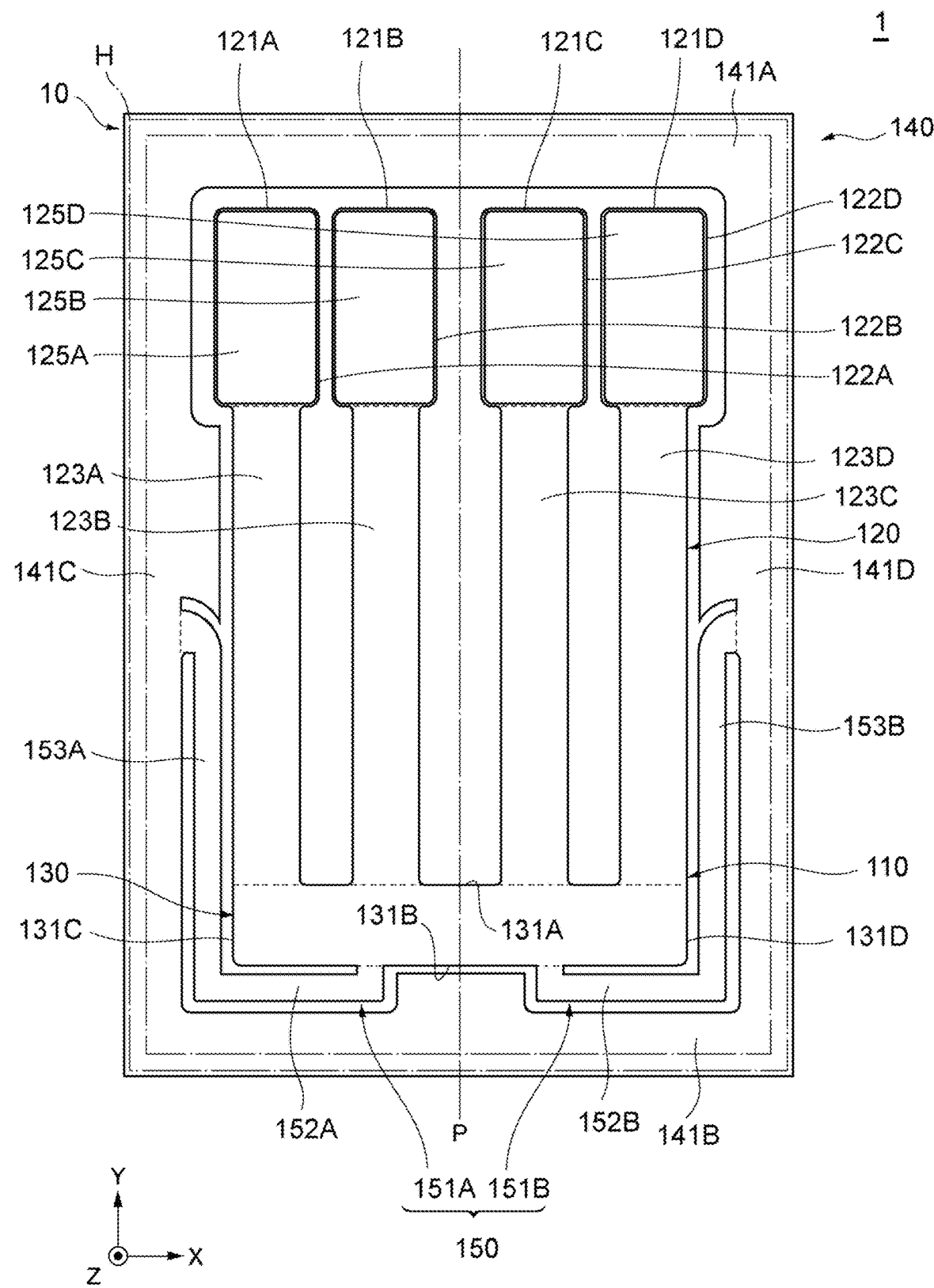
FIG. 3 is a plan view of an internal portion of the resonance device according to the first exemplary embodiment.

Next, schematic configurations of the vibration part 110, the holding part 140, and the supporting arm 150 of the resonator 10 when seen in plan view are described with reference to FIG. 3. FIG. 3 is a plan view of an internal portion of the resonance device according to the first exemplary embodiment. Note that FIG. 3 shows the shape of the resonator 10 when seen in plan view from the upper cover 30 side. For purposes of this disclosure, the dimension in the Y-axis direction is referred to as the "length", and the dimension in the X-axis direction is referred to as the "width".

For example, the resonator 10 is formed plane-symmetrically with respect to an imaginary plane P that is in parallel to the YZ plane. That is, the shape of each of the vibration part 110, the holding part 140, and the supporting arm 150 is formed substantially plane-symmetrically with respect to the imaginary plane P.

As illustrated in FIG. 3, the vibration part 110 includes an excitation part 120 including four vibration arms 121A, 121B, 121C, and 121D, and a base part 130 connected to the excitation part 120. Note that the number of the vibration arms is not limited to four, but can be set to any number of one or more in alternative aspects. In the present exemplary embodiment, the excitation part 120 and the base part 130 are formed integrally. The vibration part 110 and the holding part 140 has a space formed therebetween with a given gap.

The vibration arms 121A to 121D each extends in the Y-axis direction, and they are aligned in this order in the X-axis direction having a given gap therebetween. The vibration arms 121A to 121D include a fixed end connected to the base part 130, and an open end farthest from the base part 130. The vibration arms 121A to 121D respectively include tip-end parts 122A to 122D provided at the open-end side, and arm parts 123A to 123D connecting the base part 130 and the tip-end parts 122A to 122D. The tip-end parts 122A to 122D have relatively large displacement in the vibration part 110. The imaginary plane P is located between the vibration arm 121B and the vibration arm 121C.

Among the four vibration arms 121A to 121D, the vibration arms 121A and 121D are considered outer vibration arms disposed at an outer side in the X-axis direction, and the vibration arms 121B and 121C are considered inner vibration arms disposed at an inner side in the X-axis direction. The inner vibration arm 121B and the inner vibration arm 121C have a mutually symmetrical structure with respect to the imaginary plane P, and the outer vibration arm 121A and the outer vibration arm 121D have a mutually symmetrical structure with respect to the imaginary plane P.

The tip-end parts 122A to 122D respectively include metal films 125A to 125D on surfaces at the upper cover 30 side. The metal films 125A to 125D function as mass addition films that respectively make the mass per unit length (hereinafter, simply be referred to as the "mass") of the tip-end parts 122A to 122D larger than the mass of the arm parts 123A to 123D. Thereby, the metal films 125A to 125D increase the amplitude while reducing the size of the vibration part 110. Moreover, the metal films 125A to 125D can be used as a so-called frequency adjustment film that is used to adjust a resonant frequency by scraping a part of the metal films 125A to 125D.

The width of the tip-end part 122A is larger than the width of the arm part 123A. The same holds for the tip-end parts 122B to 122D and the arm parts 123B to 123D. Thereby, even when the metal films 125A to 125D are omitted, the weights of the tip-end parts 122A to 122D are still respectively larger than the weights of the arm parts 123A to 123D. However, the widths of the tip-end parts 122A to 122D can respectively be smaller than or equal to the widths of the arm parts 123A to 123D.

As shown, the shape of each of the tip-end parts 122A to 122D is a substantially rectangular shape having a curved shape with four rounded corners (for example, a so-called rounded shape). The shape of each of the arm parts 123A to 123D is a substantially rectangular shape having a rounded shape at near a root part connected to the base part 130, and near a connection part connected to each of the tip-end parts 122A to 122D. However, each of the tip-end parts 122A to 122D and the arm parts 123A to 123D is not limited to have the shape described above. For example, each of the tip-end parts 122A to 122D can have a trapezoid shape or an L-shape in alternative aspects. Moreover, each of the arm parts 123A to 123D can have a trapezoid shape, and a slit, a recess part, or a protrusion part can be formed at the arm parts 123A to 123D.

The shape and size of each of the vibration arms 121A to 121D is substantially the same. The length of each of the vibration arms 121A to 121D is, for example, about 450 μm. For example, the length of each of the arm parts 123A to 123D is about 300 μm, and the width thereof is about 50 μm. For example, the length of each of the tip-end parts 122A to 122D is about 150 μm, and the width thereof is about 70 μm.

The base part 130 includes a front-end part 131A, a back-end part 131B, a left-end part 131C, and a right-end part 131D. Each of the front-end part 131A, the back-end part 131B, the left-end part 131C, and the right-end part 131D is a part of an outer edge portion of the base part 130. The front-end part 131A is an end part extending in the X-axis direction at the vibration arms 121A to 121D side. The back-end part 131B is an end part extending in the X-axis direction at the side opposite to the vibration arms 121A to 121D. The left-end part 131C is an end part extending in the Y-axis direction at the vibration arm 121A side when seen from the vibration arm 121D. The right-end part 131D is an end part extending in the Y-axis direction at the vibration arm 121D side when seen from the vibration arm 121A. The vibration arms 121A to 121D are connected to the front-end part 131A.

The base part 130 has a substantially rectangular shape in which the front-end part 131A and the back-end part 131B are the long sides and the left-end part 131C and the right-end part 131D are the short sides. The imaginary plane P is defined along a perpendicular bisector of each of the front-end part 131A and the back-end part 131B. It is noted that the base part 130 is not limited to that described above as long as it has a substantially plane-symmetrical structure with respect to the imaginary plane P, and for example, the base part 130 can have a trapezoid shape in which one of the front-end part 131A and the back-end part 131B is longer than the other. Moreover, at least one of the front-end part 131A, the back-end part 131B, the left-end part 131C, and the right-end part 131D can be bent or curved.

In some exemplary embodiments, a base part length, which is the largest distance in the Y-axis direction between the front-end part 131A and the back-end part 131B, is about 35 μm. Moreover, in an exemplary embodiment, a base part width, which is the largest distance in the X-axis direction between the left-end part 131C and the right-end part 131D, is about 265 μm. Note that, in the configuration example shown in FIG. 3, the base part length corresponds to the length of the left-end part 131C or the right-end part 131D, and the base part width corresponds to the width of the front-end part 131A or the back-end part 131B.

As illustrated in FIG. 3, the holding part 140 includes a front frame 141A, a back frame 141B, a left frame 141C, and a right frame 141D. Each of the front frame 141A, the back frame 141B, the left frame 141C, and the right frame 141D is a part of the substantially rectangular frame body surrounding the vibration part 110. In an exemplary aspect, the front frame 141A is a portion extending in the X-axis direction at the excitation part 120 side when seen from the base part 130. The back frame 141B is a portion extending in the X-axis direction at the base part 130 side when seen from the excitation part 120. The left frame 141C is a portion extending in the Y-axis direction at the vibration arm 121A side when seen from the vibration arm 121D. The right frame 141D is a portion extending in the Y-axis direction at the vibration arm 121D side when seen from the vibration arm 121A. Each of the front frame 141A and the back frame 141B is bisected by the imaginary plane P.

As further shown, both ends of the left frame 141C are connected to the respective ones of one end of the front frame 141A and one end of the back frame 141B. Both ends of the right frame 141D are connected to the respective ones of the other end of the front frame 141A and the other end of the back frame 141B. The front frame 141A and the back frame 141B are opposed to one another in the Y-axis direction while sandwiching the vibration part 110 therebetween. The left frame 141C and the right frame 141D are opposed to one another in the X-axis direction while sandwiching the vibration part 110 therebetween.

The supporting arm 150 is provided on the inner side of the holding part 140 so as to connect the base part 130 and the holding part 140. In the exemplary configuration shown in FIG. 3, the supporting arm 150 includes a left supporting arm 151A and a right supporting arm 151B when seen in plan view from the upper cover 30 side. The imaginary plane P is located between the right supporting arm 151B and the left supporting arm 151A, and the right supporting arm 151B and the left supporting arm 151A are plane-symmetry with one another.

The left supporting arm 151A connects the back-end part 131B of the base part 130 and the left frame 141C of the holding part 140. The right supporting arm 151B connects the back-end part 131B of the base part 130 and the right frame 141D of the holding part 140. The left supporting arm 151A includes a support back arm 152A and a support side arm 153A, and the right supporting arm 151B includes a support back arm 152B and a support side arm 153B.

The support back arms 152A and 152B extend from the back-end part 131B of the base part 130 between the back-end part 131B of the base part 130 and the holding part 140. In an exemplary aspect, the support back arm 152A extends from the back-end part 131B of the base part 130 toward the back frame 141B, and then is bent to extend toward the left frame 141C. The support back arm 152B extends from the back-end part 131B of the base part 130 toward the back frame 141B, and then is bent to extend toward the right frame 141D. The width of each of the support back arms 152A and 152B is smaller than the width of each of the vibration arms 121A to 121D.

The support side arm 153A extends along the outer vibration arm 121A between the outer vibration arm 121A and the holding part 140. The support side arm 153B extends along the outer vibration arm 121D between the outer vibration arm 121D and the holding part 140. In an exemplary aspect, the support side arm 153A extends from an end portion of the support back arm 152A at the left frame 141C side toward the front frame 141A, and then is bent to be connected to the left frame 141C. The support side arm 153B extends from an end portion of the support back arm 152B at the right frame 141D side toward the front frame 141A, and then is bent to be connected to the right frame 141D. The width of each of the support side arms 153A and 153B is substantially equal to the width of each of the support back arms 152A and 152B.

It is noted that the supporting arm 150 is not limited to have the configuration described above. For example, the supporting arm 150 can be connected to the left-end part 131C and the right-end part 131D of the base part 130 in an alternative aspect. Moreover, the supporting arm 150 can be connected to the front frame 141A or the back frame 141B of the holding part 140. Moreover, the number of the supporting arms 150 can be one, or can be three or more in other alternative aspects.

Figure 4:
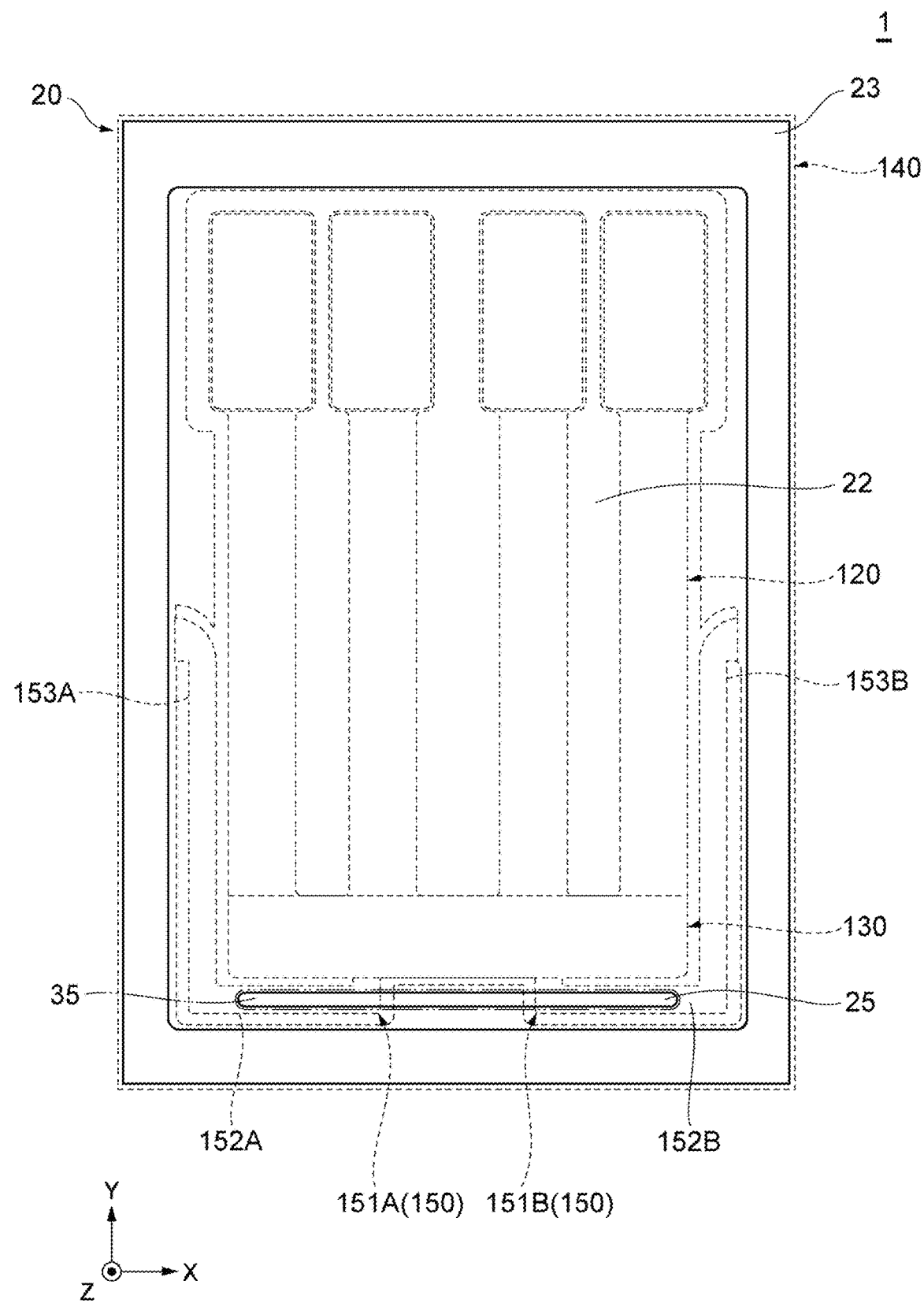
FIG. 4 is a plan view of an internal portion of the resonance device according to the first exemplary embodiment.
Figure 5:
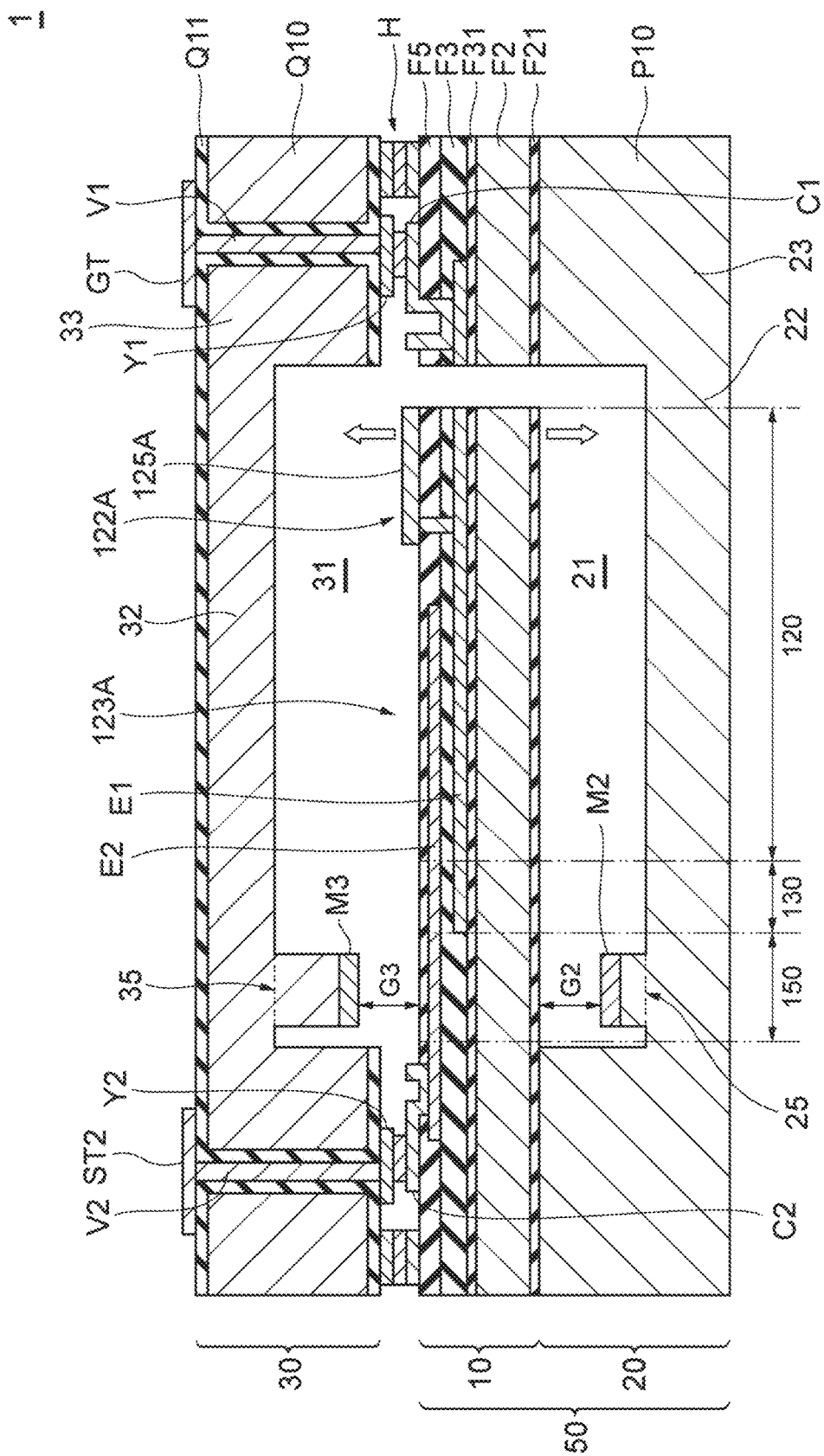
FIG. 5 is a sectional view of the resonance device according to the first exemplary embodiment.

Next, with reference to FIGS. 4 and 5, a structure of the resonance device 1 according to the first exemplary embodiment along the Z-axis direction is described. FIG. 4 is a plan view of an internal portion of the resonance device according to the first exemplary embodiment. FIG. 5 is a sectional view of the resonance device according to the first exemplary embodiment. Note that FIG. 4 shows the shape of the lower cover 20 when seen in plan view from the upper cover 30 side. Moreover, FIG. 5 is a diagram for schematically explaining a multilayer structure of the resonance device 1, and the component members illustrated in FIG. 5 are not necessarily positioned on a cross section in the same plane. For purposes of this disclosure, the direction from the lower cover 20 to the upper cover 30 is referred to as "up (upward)", and the direction from the upper cover 30 to the lower cover 20 is referred to as "down (downward)".

The resonator 10 is held between the lower cover 20 and the upper cover 30. In an exemplary aspect, the holding part 140 of the resonator 10 is joined to each of the side wall 23 of the lower cover 20 and the side wall 33 of the upper cover 30. In this manner, the lower cover 20, the upper cover 30, and the holding part 140 form the vibration space where the vibration part 110 is vibratable. Each of the resonator 10, the lower cover 20, and the upper cover 30 is formed using a silicon (Si) substrate in an exemplary embodiment. Note that each of the resonator 10, the lower cover 20, and the upper cover 30 can be formed using a silicon on insulator (SOI) substrate in which a silicon layer and a silicon oxide film are laminated on one another. Moreover, each of the resonator 10, the lower cover 20, and the upper cover 30 can be formed using a substrate other than the silicon substrate as long as processing using microfabrication technology is applicable to the substrate. Examples of the substrate other than the silicon substrate include a compound semiconductor substrate, a glass substrate, a ceramic substrate, a resin substrate, and combination thereof.

As illustrated in FIG. 5, the resonator 10 includes a silicon oxide film F21, a silicon substrate F2, an insulating film F31, the metal film E1, a piezoelectric film F3, the metal film E2, and a protection film F5. The resonator 10 further includes, at the tip-end parts 122A to 122D, the metal films 125A to 125D described above. The vibration part 110, the holding part 140, and the supporting arm 150 are formed integrally through the same process. In an exemplary aspect, patterning through removal processing is performed with respect to a multilayer body including the silicon substrate F2, the insulating film F31, the metal film E1, the piezoelectric film F3, the metal film E2, the protection film F5, and the like, thereby forming the vibration part 110, the holding part 140, and the supporting arm 150. The removal processing is performed through, for example, dry-etching in which an argon (Ar) ion beam is radiated. It should be appreciated that the removal processing can be performed through other methods, such as wet-etching and laser-etching.

The silicon oxide film F21 is provided to a lower surface of the silicon substrate F2, and is sandwiched between a silicon substrate P10 and the silicon substrate F2. The silicon oxide film F21 is made of a silicon oxide containing $SiO_2$ and the like, for example. A part of the silicon oxide film F21 is exposed to the cavity 21 of the lower cover 20. The silicon oxide film F21 is configured to function as a temperature characteristics correction layer that reduces a temperature coefficient resonant frequency of the resonator 10, that is, a change rate of the resonant frequency per unit temperature, at least at the vicinity of room temperature. Therefore, the silicon oxide film F21 improves the temperature characteristics of the resonator 10. Note that the silicon oxide film can be formed on the upper surface of the silicon substrate F2, or can be formed on both of the upper surface and the lower surface of the silicon substrate F2.

In an exemplary aspect, the silicon substrate F2 is made of a single crystal of silicon. For example, the silicon substrate F2 is made of a degenerated n-type silicon (Si) semiconductor having the thickness of about 6 µm. The silicon substrate F2 can contain, as an n-type dopant, phosphorus (P), arsenic (As), antimony (Sb), or the like. A resistance value of degenerate silicon (Si) used for the silicon substrate F2 is, for example, less than 16 mΩ·cm, and more desirably 1.2 mΩ·cm or less.

The insulating film F31 is provided between the silicon substrate F2 and the metal film E1. The insulating film F31 suppresses occurrence of parasitic capacitance and occurrence of short-circuiting at an end portion of the resonance device 1. For example, the insulating film F31 is made of a piezoelectric material similar to the piezoelectric film F3. The material of the insulating film F31 is not limited to this, and can be, for example, a silicon oxide, a silicon nitride, or the like. Note that the insulating film F31 can be omitted.

The metal film E1 is stacked on the insulating film F31, the piezoelectric film F3 is stacked on the metal film E1, and the metal film E2 is stacked on the piezoelectric film F3. Each of the metal films E1 and E2 includes a portion that is configured to function as an excitation electrode that excites the vibration arms 121A to 121D, and a portion that is configured to function as an extended electrode that electrically connects the excitation electrode to an external power source. The portions functioning as the excitation electrode in the respective metal films E1 and E2 are opposed to one another while sandwiching the piezoelectric film F3 therebetween at the arm parts 123A to 123D of the vibration arms 121A to 121D. The portions functioning as the extended electrode in the metal films E1 and E2 are, for example, extended from the base part 130 to the holding part 140 via the supporting arm 150. The metal film E1 is electrically continuous across the entire resonator 10. The metal film E2 is electrically isolated between a portion formed at the outer vibration arms 121A and 121D and a portion formed at the inner vibration arms 121B and 121C. The metal film E1 corresponds to one example of the lower electrode, and the metal film E2 corresponds to one example of the upper electrode. Note that the insulating film F31 can be omitted, and in this case, the metal film E1 is provided on the silicon substrate F2.

The thickness of each of the metal films E1 and E2 is, for example, about 0.1 µm or more and 0.2 µm or less. The metal films E1 and E2 are film-formed and then patterned to be the excitation electrode, the extended electrode, and the like through removal processing such as etching. The metal films E1 and E2 are made of, for example, a metal material whose crystal structure is body-centered cubic. In an exemplary aspect, the metal films E1 and E2 are made of molybdenum (Mo), tungsten (W), or the like. In a case in which the silicon substrate F2 is a degenerate semiconductor substrate having high conductivity, the metal film E1 can be omitted, and the silicon substrate F2 can function as the lower electrode.

The piezoelectric film F3 is a thin film made of a piezoelectric material that performs conversion between electrical energy and mechanical energy. The piezoelectric film F3 extends and contracts in the Y-axis direction in the in-plane direction of the XY plane in accordance with an electric field applied between the metal film E1 and the metal film E2. This extension and contraction of the piezoelectric film F3 causes the vibration arms 121A to 121D to bend to have displacement at their open end toward the bottom plate 22 of the lower cover 20 and the bottom plate 32 of the upper cover 30. Alternating voltage with mutually opposite phases is applied to the upper electrode of the outer vibration arms 121A and 121D and the upper electrode of the inner vibration arms 121B and 121C. Therefore, the outer vibration arms 121A and 121D and the inner vibration arms 121B and 121C vibrate with the opposite phases. For example, when the open end of the outer vibration arms 121A and 121D has displacement toward the lower cover 20, the open end of the inner vibration arms 121B and 121C has displacement toward the upper cover 30. Such vibration with the opposite phases causes, in the vibration part 110, torsional moment centering on a rotational axis extending in the Y-axis direction. The base part 130 bends due to this torsional moment, and the left-end part 131C and the right-end part 131D have displacement toward the lower cover 20 or the upper cover 30. That is, the vibration part 110 of the resonator 10 vibrates in an out-of-plane bending vibration mode.

For example, the piezoelectric film F3 is made of a piezoelectric material having a crystal structure of a wurtzite-type hexagonal crystal structure. Examples of such a piezoelectric material include a nitride and an oxide, such as aluminum nitride (AlN), scandium aluminum nitride (ScAlN), zinc oxide (ZnO), gallium nitride (GaN), and indium nitride (InN). Note that scandium aluminum nitride is obtained by part of aluminum in aluminum nitride being replaced by scandium. Similarly, a piezoelectric material in which part of aluminum in aluminum nitride is replaced by another element can be a piezoelectric material in which the part of aluminum is replaced by two elements of magnesium (Mg) and niobium (Nb) or two elements of magnesium (Mg) and zirconium (Zr). For example, the thickness of the piezoelectric film F3 is about 1 µm, but can be about 0.2 µm to 2 µm.

The protection film F5 is stacked on the metal film E2. The protection film F5 protects the metal film E2 from oxidation, for example. A material of the protection film F5 is, for example, an oxide, a nitride, or an oxynitride, including aluminum (Al), silicon (Si), or tantalum (Ta). A parasitic capacitance reduction film that reduces parasitic capacitance formed between internal wires of the resonator 10 can be stacked on the protection film F5.

The metal films 125A to 125D are stacked on the protection film F5 at the tip-end parts 122A to 122D. The metal films 125A to 125D can function as the frequency adjustment film as well as functioning as the mass addition film. From the viewpoint as the frequency adjustment film, the metal films 125A to 125D are desirably made of a material whose mass reduction rate by etching is higher than that of the protection film F5. The mass reduction rate is represented by a product of an etching rate and a density. The etching rate is a thickness to be removed per unit time. A magnitude relation regarding the etching rate between the protection film F5 and the metal films 125A to 125D is arbitrary as long as the relation regarding the mass reduction rate is as described above. Moreover, from the viewpoint as the mass addition film, the metal films 125A to 125D are desirably made of a material with large specific gravity. From the above two viewpoints, the material of the metal films 125A to 125D is, for example, a metal material, such as molybdenum (Mo), tungsten (W), gold (Au), platinum (Pt), nickel (Ni), and titanium (Ti). Note that in the case in which the metal films 125A to 125D are used as the frequency adjustment film, a part of the protection film F5 can be removed together in trimming processing of the metal films 125A to 125D. In such a case, the protection film F5 also corresponds to the frequency adjustment film.

A part of each of the metal films 125A to 125D is removed through trimming processing in a process of adjusting a frequency. The trimming processing of the metal films 125A to 125D is dry-etching in which, for example, an argon (Ar) ion beam is radiated. The ion beam is excellent at processing efficiency because it can irradiate a wide range, whereas it can charge the metal films 125A to 125D. The metal films 125A to 125D are desirably grounded in order to prevent coulombic interaction due to charging of the metal films 125A to 125D from changing a vibration track of the vibration arms 121A to 121D to deteriorate the vibration characteristics of the resonator 10. Therefore, the metal film 125A is electrically connected to the metal film E1 by a through-electrode penetrating the piezoelectric film F3 and the protection film F5. Similarly, the metal films 125B to 125D (not illustrated) are also electrically connected to the metal film E1 by through-electrodes. Note that the metal films 125A to 125D can be electrically connected to the metal film E1 by side-surface electrodes provided to side surfaces of the tip-end parts 122A to 122D, for example. The metal films 125A to 125D can be electrically connected to the metal film E2.

Extended wires C1 and C2 are formed on the protection film F5 of the holding part 140. The extended wire C1 is electrically connected to the metal film E1 through a through-hole formed in the piezoelectric film F3 and the protection film F5. The extended wire C2 is electrically connected to the metal film E2 of the outer vibration arms 121A and 121D through a through-hole formed in the protection film F5. Although not illustrated, an extended wire electrically connected to the metal film E2 of the inner vibration arms 121B and 121C is also formed on the protection film F5. The extended wires C1 and C2 are made of a metal material, such as aluminum (Al), germanium (Ge), gold (Au), and tin (Sn).

The bottom plate 22, the side wall 23, and the limiting part 25 of the lower cover 20 are integrally formed by the silicon substrate P10. The silicon substrate P10 is made of an undegenerated silicon semiconductor and has resistivity of, for example, 10 Ω·cm or more. The thickness of the lower cover 20 is larger than the thickness of the silicon substrate F2, and is, for example, about 150 μm.

As illustrated in FIG. 4, the limiting part 25 is provided in an isolated manner to be apart from the side wall 23. The limiting part 25 is opposed to the support back arm 152A of the left supporting arm 151A and the support back arm 152B of the right supporting arm 151B in the thickness direction. The limiting part 25 is provided to have a strip shape where a longitudinal direction is the X-axis direction. As illustrated in FIG. 5, the limiting part 25 projects from the bottom plate 22 toward the resonator 10. A distance G2 between the limiting part 25 and the resonator 10 in the thickness direction is larger than an amplitude of the supporting arm 150 in the thickness direction at the time of normal operation of the resonance device 1, and smaller than a distance between the bottom plate 22 and the resonator 10 in the thickness direction. In the present exemplary embodiment, the limiting part 25 is provided outside of the vibration part 110 in plan view, and therefore, the distance G2 can be smaller than an amplitude of the vibration part 110 in the thickness direction at the time of normal operation of the resonance device 1.

The limiting part 25 includes a metal film M2 at a tip-end part facing the resonator 10 in the thickness direction. The metal film M2 is configured to function as a buffer film that is deformed to mitigate impact when the support back arm 152A and the support back arm 152B contact the limiting part 25. Moreover, the metal film M2 also is configured to function as a getter that occludes hydrogen gas, organic gas, and the like to improve degree of vacuum of the cavities 21 and 31. The metal film M2 is made of, for example, titanium (Ti), zirconium (Zr), vanadium (V), niobium (Nb), tantalum (Ta), or an alloy containing at least one of them. The metal film M2 can be made of a metal with a bulk modulus lower than that of gold (Au). For example, the metal film M2 has a single-layer structure, or it can have a multi-layer structure. Between the metal film M2 and the silicon substrate P10 of the limiting part 25, layers (not illustrated) such as a diffusion prevention layer that prevents diffusion of hydrogen and an underlying layer that improves close contact between the metal film M2 and the silicon substrate P10 can be provided.

Note that the limiting part 25 according to the present exemplary embodiment is arranged in an isolated manner to be opposed to the support back arms 152A and 152B. However, the arrangement of the limiting part at the lower cover side according to an exemplary embodiment of the present disclosure is not limited to this. From the viewpoint of increasing a surface area to improve the function as a getter, the limiting part at the lower cover side can be connected to the side wall of the lower cover. From a similar viewpoint, the limiting part at the lower cover side can be opposed not only to the support back arm, but also to at least one of the support side arm, the base part, and the vibration arm. When seen in plan view, the limiting part at the lower cover side can be opposed to at least one of the base part and the vibration arm while avoiding the supporting arm. Moreover, the limiting part at the lower cover side can extend to the outside of the supporting arm and the vibration part in plan view.

Assuming that the resonator 10 and the lower cover 20 form the MEMS substrate 50, for example, the silicon substrate P10 of the lower cover 20 corresponds to a support substrate (handle layer) of an SOI substrate, the silicon oxide film F21 of the resonator 10 corresponds to a BOX layer of the SOI substrate, and the silicon substrate F2 of the resonator 10 corresponds to an active layer (device layer) of the SOI substrate.

The bottom plate 32, the side wall 33, and the limiting part 35 of the upper cover 30 are integrally formed by a silicon substrate Q10. A silicon oxide film Q11 is provided to a surface of the silicon substrate Q10. In an exemplary aspect, the silicon oxide film Q11 is provided to a region between the silicon substrate Q10 and through-electrodes V1 and V2 described later, a region between the silicon substrate Q10 and inner terminals Y1 and Y2 described later, and a region between the silicon substrate Q10 and the outer terminal. The silicon oxide film Q11 impedes short-circuiting of an electrode and the like via the silicon substrate Q10. Note that, in the surface of the silicon substrate Q10, an inner wall of the cavity 31 is not provided with an electrode or the like that becomes a cause of short-circuiting. Therefore, the silicon substrate Q10 can be exposed at the inner wall of the cavity 31. The silicon oxide film Q11 is formed, for example, by thermal oxidation of the silicon substrate Q10 or chemical vapor deposition (CVD). The thickness of the upper cover 30 is, for example, about 150 μm.

Similarly to the limiting part 25, the limiting part 35 is provided in an isolated manner to be apart from the side wall 33. The limiting part 35 is opposed to the support back arm 152A of the left supporting arm 151A and the support back arm 152B of the right supporting arm 151B in the thickness direction. The limiting part 35 substantially overlaps with the limiting part 25 in plan view. As illustrated in FIG. 5, the limiting part 35 projects from the bottom plate 32 toward the resonator 10. A distance G3 between the limiting part 35 and the resonator 10 in the thickness direction is larger than an amplitude of the supporting arm 150 in the thickness direction at the time of normal operation of the resonance device 1, and smaller than a distance between the bottom plate 32 and the resonator 10 in the thickness direction. For example, the distance G3 is substantially the same as the distance G2. In the present exemplary embodiment, the limiting part 35 is provided outside of the vibration part 110 in plan view, and therefore, the distance G3 can be smaller than an amplitude of the vibration part 110 in the thickness direction at the time of normal operation of the resonance device 1.

The limiting part 35 includes a metal film M3 at a tip-end part facing the resonator 10 in the thickness direction. Similarly to the metal film M2 of the limiting part 25, the metal film M3 is configured to function as a buffer film and a getter. The metal film M3 is made of, for example, a metal material that is similar to the material for the metal film M2. Layers (not illustrated) such as a diffusion prevention layer and an underlying layer can be provided between the metal film M3 and the silicon substrate Q10 of the limiting part 35.

Note that, similarly to the limiting part at the lower cover side, the limiting part at the upper cover side according to an exemplary embodiment of the present disclosure can be connected to the side wall of the upper cover, or can further be opposed to at least one of the support side arm, the base part, and the vibration arm. When seen in plan view, the limiting part at the upper cover side can be opposed to at least one of the base part and the vibration arm while avoiding the supporting arm. The limiting part at the upper cover side can extend to the outside of the supporting arm and the vibration part in plan view.

Moreover, although the limiting part 35 overlaps with the limiting part 25 in plan view and the limiting part 35 and the limiting part 25 have the substantially same size as one another, the positional relation and the size relation between the limiting parts at the lower cover side and the upper cover side are not limited to these. According to an exemplary embodiment of the present disclosure, the limiting part at the upper cover side can be provided at a position different from the limiting part at the lower cover side in plan view. For example, the limiting part at the lower cover side can be opposed to the supporting arm, and the limiting part at the upper cover side can be opposed to the base part. Moreover, according to an exemplary embodiment of the present disclosure, one of the limiting parts at the lower cover side and the upper cover side can be made larger than the other one of them to enhance a function of the metal film of the larger limiting part as a getter.

Moreover, although the metal film M3 and the metal film M2 are made of, for example, the same metal material, they can be made of different metal materials. For example, the metal film of either the limiting part at the lower cover side or the limiting part at the upper cover side, where larger impact is applied, can be made of a metal material with higher shock-absorbing capability than that of the metal film to which smaller impact is applied.

The through-electrodes V1 and V2 are provided to the upper cover 30. The through-electrodes V1 and V2 are provided inside through-holes penetrating the side wall 33 in the Z-axis direction. The through-electrodes V1 and V2 are surrounded by the silicon film Q11, thereby being insulated from one another. The through-electrodes V1 and V2 are, for example, formed by polycrystalline silicon (Poly-Si), copper (Cu), gold (Au), or the like being filled into the through-holes.

The inner terminals Y1 and Y2 are provided to a lower surface of the upper cover 30. The inner terminal Y1 is electrically connected to the ground terminal GT by the through-electrode V1. The inner terminal Y2 is electrically connected to the power terminal ST2 by the through-electrode V2. The inner terminal Y1 is a connection terminal that electrically connects the through-electrode V1 and the extended wire C1. The inner terminal Y2 is a connection terminal that electrically connects the through-electrode V2 and the extended wire C2. Note that, although not illustrated, an inner terminal and a through-hole that electrically connect the metal film E2 of the inner vibration arms 121B and 121C and the power terminal ST1 are further provided to the upper cover 30.

The plurality of inner terminals including the inner terminals Y1 and Y2 are electrically insulated from one another by the silicon oxide film Q11. The plurality of outer terminals including the ground terminal GT and the power terminal ST2 are also electrically insulated from one another by the silicon oxide film Q11. For example, the plurality of inner terminals and the plurality of outer terminals are formed by application of plating of nickel (Ni), gold (Au), silver (Ag), copper (Cu), or the like to a metallization layer (underlying layer), such as chromium (Cr), tungsten (W), nickel (Ni), or the like.

A joint part H is formed between the side wall 33 of the upper cover 30 and the holding part 140 of the resonator 10. The joint part H is formed to have a frame shape that continues in a circumferential direction in such a manner as to surround the vibration part 110 when seen in plan view. The joint part H hermetically seals the vibration space formed by the cavities 21 and 31 in the vacuum state. For example, the joint part H is formed by a metal film in which an aluminum (Al) film, a germanium (Ge) film, and an aluminum (Al) film are stacked in this order from the resonator 10 side to be eutectic bonded with one another. The joint part H can include gold (Au), tin (Sn), copper (Cu), titanium (Ti), aluminum (Al), germanium (Ge), silicon (Si), and an alloy including at least one type of them. Moreover, the joint part H can include an insulating material including a metal compound, such as titanium nitride (TiN) and tantalum nitride (TaN), so as to improve close contact between the resonator 10 and the upper cover 30. Note that although each metal film of the joint part H is illustrated as an independent film, in practice, it forms a eutectic alloy, and thereby a clear border does not necessarily exist.

As described above, the upper cover 30 includes the limiting part 35 that limits displacement of the support back arms 152A and 152B, and the metal film M3 that is configured to function as a getter is provided to the tip-end part of the limiting part 35.

Therefore, the limiting part 35 is brought in contact with the support back arms 152A and 152B when the resonance device 1 receives impact due to falling or the like, thereby limiting displacement of the vibration part 110 and the supporting arm 150 toward the upper cover 30. Therefore, damage attributed to deformation of the supporting arm 150 toward the upper cover 30 is suppressed. In addition, since the metal film M3 is configured to function as a buffer film that mitigates impact caused by contact between the limiting part 35 and the support back arms 152A and 152B, fine particles caused as a result of contact between the limiting part 35 and the support back arms 152A and 152B is also suppressed. Moreover, the metal film M3 is configured to function not only as a buffer film but also as a getter. Therefore, frequency fluctuation attributed to attachment and detachment of fine particles to/from the vibration part 110 and a decrease in degree of vacuum of the vibration space is suppressed. Furthermore, as compared to a resonance device in which a buffer film and a getter are separately provided to the upper cover, manufacturing costs can be reduced.

Furthermore, the lower cover 20 includes the limiting part 25 that limits displacement of the support back arms 152A and 152B, and the metal film M2 that is configured to function as a getter is provided to the tip-end part of the limiting part 25.

Therefore, damage attributed to deformation of the supporting arm 150 toward the lower cover 20 is suppressed, and fine particles caused as a result of contact between the limiting part 25 and the support back arms 152A and 152B is also suppressed. Thereby, as compared to a configuration in which a limiting part is provided to one of the upper cover and the lower cover, damage of the supporting arm can further be suppressed. Moreover, as compared to a configuration in which a metal film is provided to a tip-end part of one of the limiting part of the upper cover and the limiting part of the lower cover, occurrence of fine particles can further be suppressed. Furthermore, as compared to a resonance device in which a buffer film and a getter are separately provided to the lower cover, manufacturing costs can be reduced.

The limiting parts 25 and 35 are opposed to the supporting arm 150 in the thickness direction.

Therefore, abnormal displacement of the supporting arm 150, which is likely to get damaged in the resonator 10, can be suppressed without inhibition of vibration of the vibration part 110 at the time of normal operation of the resonance device 1.

In an exemplary embodiment, the metal films M2 and M3 are made of a metal with a bulk modulus lower than a bulk modulus of gold.

Therefore, the metal films M2 and M3 can have an improved function as a buffer film. Moreover, a metal with a low bulk modulus tends to excel in a hydrogen occlusion function, and thereby a decrease in degree of vacuum attributed to hydrogen gas in the vibration space of the resonance device 1 can effectively be suppressed.

Other exemplary embodiments are described below. Note that configurations which are the same as or similar to the configurations described in the first exemplary embodiment are denoted by the same or similar reference characters to suitably omit description thereof. Similar operation and effects attributed to similar configurations are not mentioned one by one.

Second Exemplary Embodiment

Figure 6:
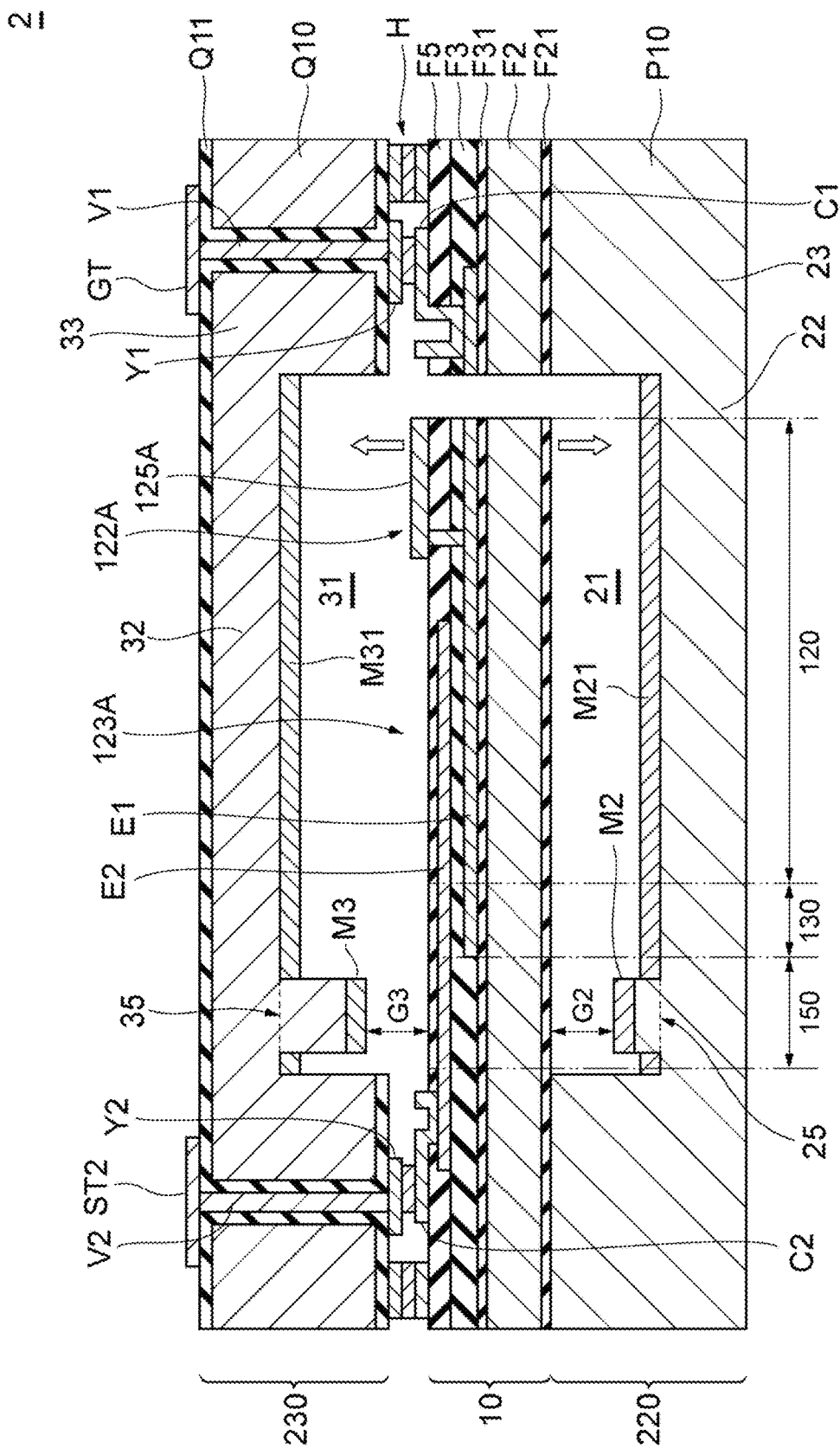
FIG. 6 is a sectional view of a resonance device according to a second exemplary embodiment.

Next, a structure of a resonance device 2 according to a second exemplary embodiment is described with reference to FIG. 6. FIG. 6 is a sectional view of the resonance device according to the second exemplary embodiment.

A surface of the bottom plate 22 of a lower cover 220 is provided with a metal film M21 that is configured to function as a getter, the surface facing the resonator 10. Moreover, a surface of the bottom plate 32 of an upper cover 230 is provided with a metal film M31 that is configured to function as a getter, the surface facing the resonator 10.

Therefore, since the volume of the getter increases, the vibration space of the resonance device 2 can have improved degree of vacuum.

A material for the metal film M21 can be the same as a material for the metal film M2.

Therefore, the metal film M21 and the metal film M2 can be provided at once in the same process. Similarly, in a case in which a material for the metal film M31 and a material for the metal film M3 are the same as one another, the metal film M31 and the metal film M3 can be provided at once in the same process. Thereby, while suppressing an increase in manufacturing costs, the vibration space of the resonance device 2 can have improved degree of vacuum by an increase in the volume of the getter.

Note that the metal film M21 can further be provided to side surfaces of the side wall 23 and the limiting part 25. The metal film M31 can further be provided to side surfaces of the side wall 33 and the limiting part 35.

Third Exemplary Embodiment

Figure 7:
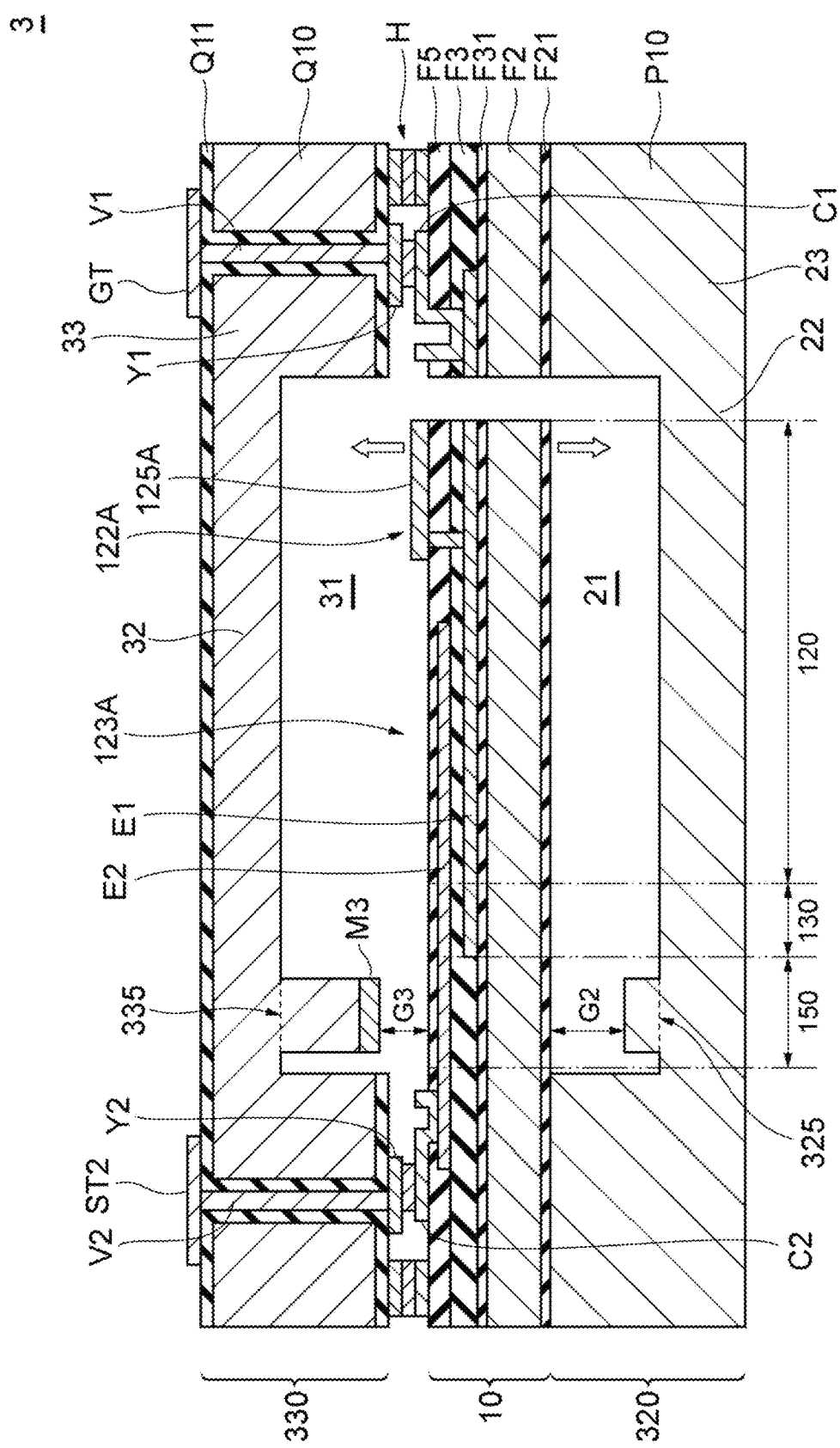
FIG. 7 is a sectional view of a resonance device according to a third exemplary embodiment.

Next, a structure of a resonance device 3 according to a third exemplary embodiment is described with reference to FIG. 7. FIG. 7 is a sectional view of the resonance device according to the third exemplary embodiment.

The distance G3 between a limiting part 335 of an upper cover 330 and the resonator 10 in the thickness direction is smaller than the distance G2 between a limiting part 325 of a lower cover 320 and the resonator 10 in the thickness direction. A tip-end part of the limiting part 335 with the smaller distance from among the distances G2 and G3 between the resonator 10 and the limiting parts 325 and 335 is provided by the metal film M3. A tip-end part of the limiting part 325 with the larger distance from among the distances G2 and G3 between the resonator 10 and the limiting parts 325 and 335 is provided by the silicon substrate P10.

Therefore, the metal film M3 is provided to the tip end of the limiting part 335 that is more likely to contact the resonator 10 from among the limiting parts 325 and 335. Thereby, even when impact is applied to the resonance device 3 due to falling or the like, impact that acts on the resonator 10 is mitigated, and damage of the resonator 10 is suppressed. Moreover, as compared to a resonance device in which metal films are provided to tip-end parts of limiting parts of both of the lower cover and the upper cover, a process of providing the metal film to the tip-end part of the limiting part 325 is omitted, and thereby manufacturing costs can be reduced.

Fourth Exemplary Embodiment

Figure 8:
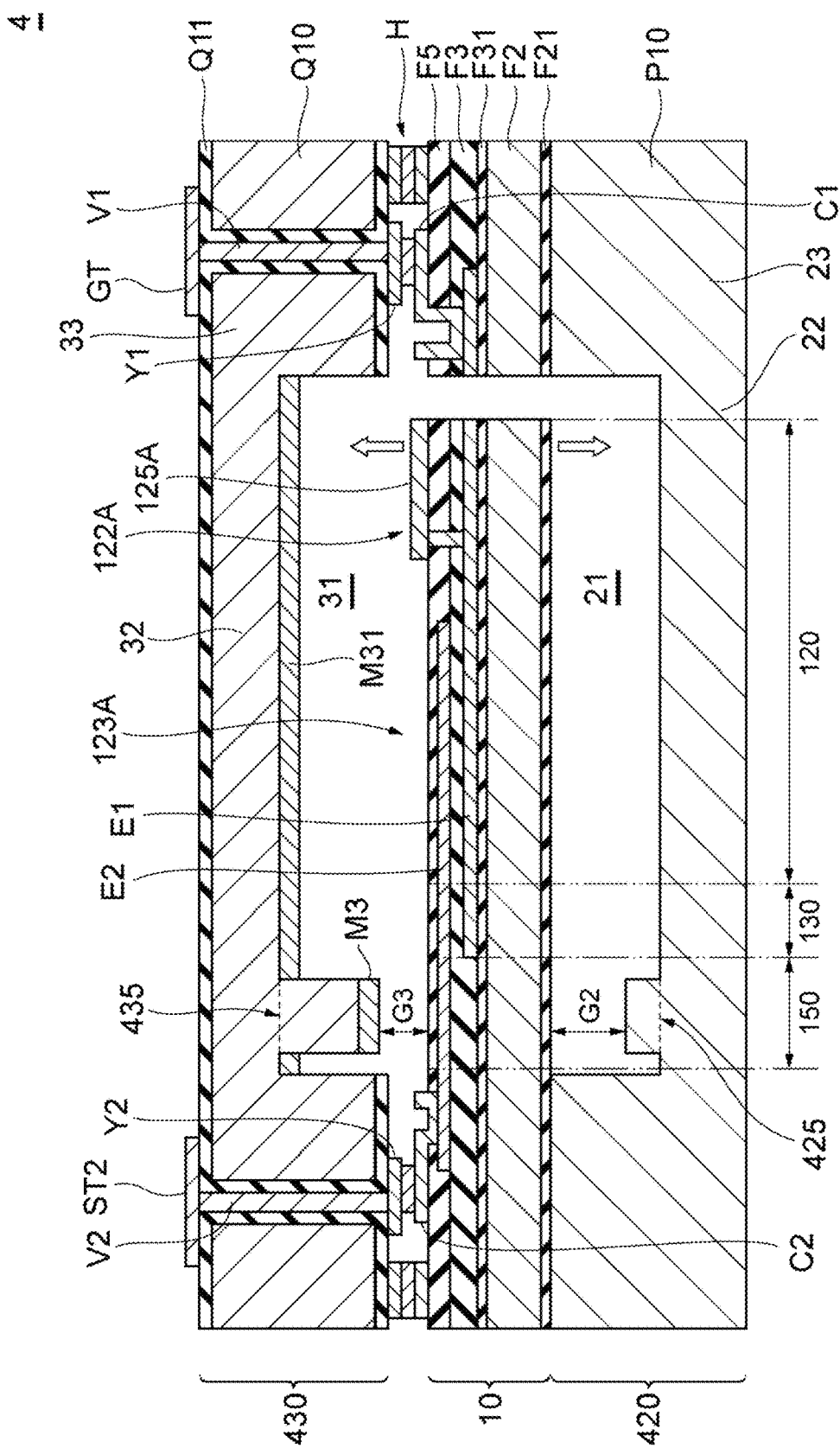
FIG. 8 is a sectional view of a resonance device according to a fourth exemplary embodiment.

Next, a structure of a resonance device 4 according to a fourth exemplary embodiment is described with reference to FIG. 8. FIG. 8 is a sectional view of the resonance device according to the fourth exemplary embodiment.

The distance G3 between a limiting part 435 of an upper cover 430 and the resonator 10 in the thickness direction is smaller than the distance G2 between a limiting part 425 of a lower cover 420 and the resonator 10 in the thickness direction. In the upper cover 430, which includes the limiting part 435 with the smaller distance from among the distances G2 and G3 between the resonator 10 and the limiting parts 425 and 435, a surface of the bottom plate 32 facing the resonator 10 is provided with the metal film M31.

Therefore, the metal film M31 can be provided at the same time in the process of providing the metal film M3. Thereby, while suppressing an increase in manufacturing costs, the vibration space of the resonance device 4 can have improved degree of vacuum by an increase in the volume of a getter.

Fifth Exemplary Embodiment

Figure 9:
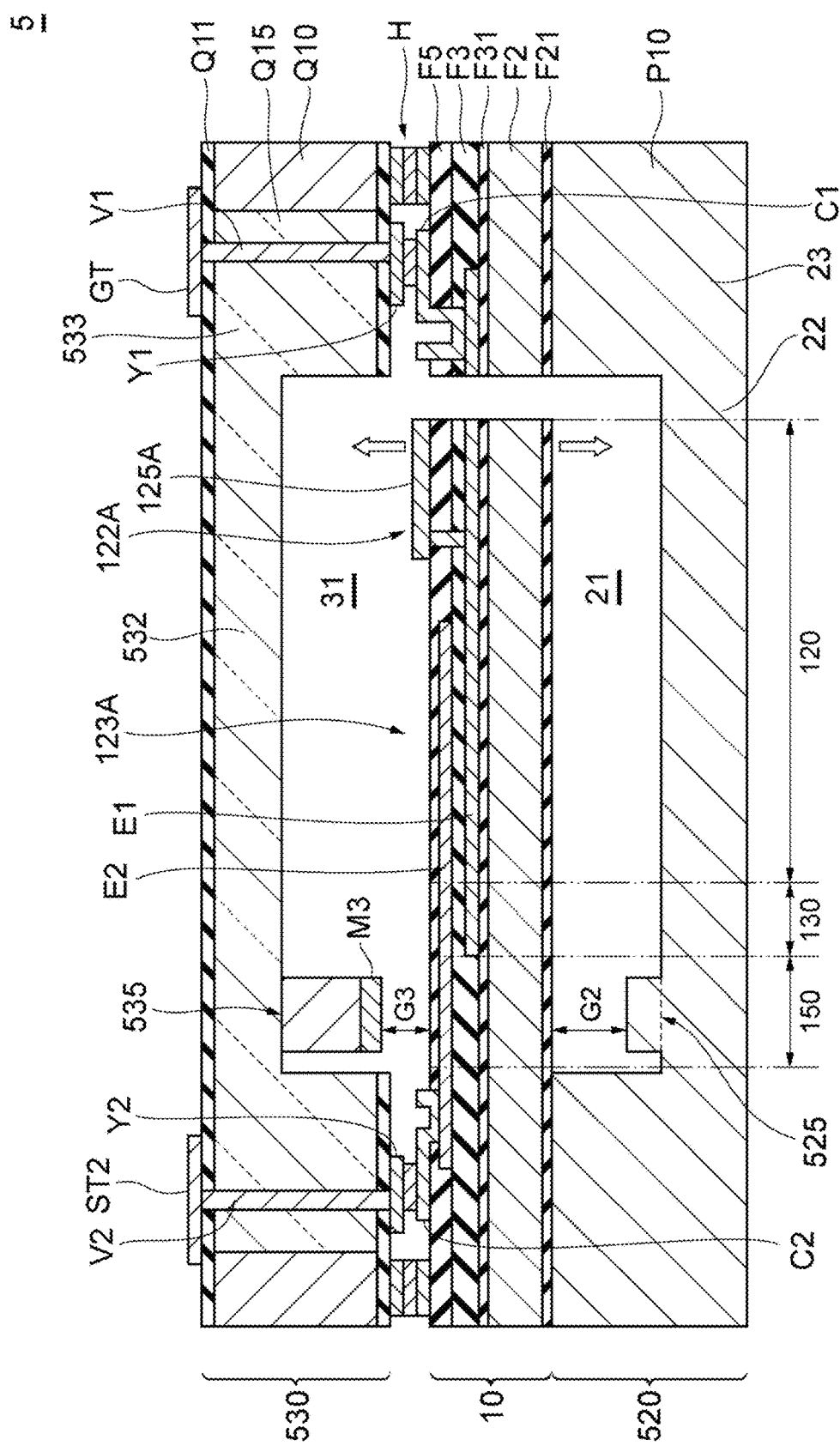
FIG. 9 is a sectional view of a resonance device according to a fifth exemplary embodiment.

Next, a structure of a resonance device 5 according to a fifth exemplary embodiment is described with reference to FIG. 9. FIG. 9 is a sectional view of the resonance device according to the fifth exemplary embodiment.

The distance G3 between a limiting part 535 of an upper cover 530 and the resonator 10 in the thickness direction is smaller than the distance G2 between a limiting part 525 of a lower cover 520 and the resonator 10 in the thickness direction. In the upper cover 530, which includes the limiting part 535 with the smaller distance from among the distances G2 and G3 between the resonator 10 and the limiting parts 525 and 535, a bottom plate 532 and a part of a side wall 533 is provided by a glass substrate Q15. In an exemplary aspect, the entire bottom plate 532 is provided by the glass substrate Q15, and a circumference of the through-electrodes V1 and V2 of the side wall 533 is provided by the glass substrate Q15. A circumference of a through-electrode (not illustrated) of the side wall 533 is also provided by the glass substrate Q15. The remaining part of the side wall 533 is provided by the silicon substrate Q10. The glass substrate Q15 is made of glass having a silicon oxide (for example, $SiO_2$) as a main component. Here, the main component of the glass refers to a component that forms 50 mass % or more of the entire components that form the glass. In an exemplary embodiment, the glass substrate Q15 is made of silicate glass whose main component is $SiO_2$.

In this way, the glass substrate Q15 having electrostatic capacity smaller than that of the silicon oxide film Q11 surrounds the e through-electrodes V1 and V2. Therefore, parasitic capacitance that occurs at the through-electrodes V1 and V2 can be reduced.

Moreover, in a case in which the silicon oxide film Q11 provided to the bottom plate 532 is thin enough to have sufficient translucency, since the bottom plate 2 is provided by the glass substrate Q15 with translucency, the resonator 10 is observable from outside. Thereby, malfunction which occurs inside the resonance device 5 after sealing is detectable through visual inspection. Similarly, also in a case in which at least a part of the bottom plate 532 is not provided with the silicon oxide film Q11, the resonator 10 is observable from outside.

Note that the entire side wall 533 can be provided by the glass substrate Q15. Moreover, the bottom plate 532 can be provided by the silicon substrate Q10 and the glass substrate Q15. Although the limiting part 535 is provided by the silicon substrate Q10, it can be provided by the glass substrate Q15.

Moreover, in the lower cover 520, which includes the limiting part 525 with the larger distance from among the distances G2 and G3 between the resonator 10 and the limiting parts 525 and 535, the bottom plate 22 and a part of the side wall 23 can be provided by a glass substrate whose main component is a silicon oxide. Independently of the distance between the limiting part and the resonator, at least a part of at least one of the lower cover and the upper cover can be provided by a glass substrate whose main component is a silicon oxide.

Sixth Exemplary Embodiment

Figure 10:
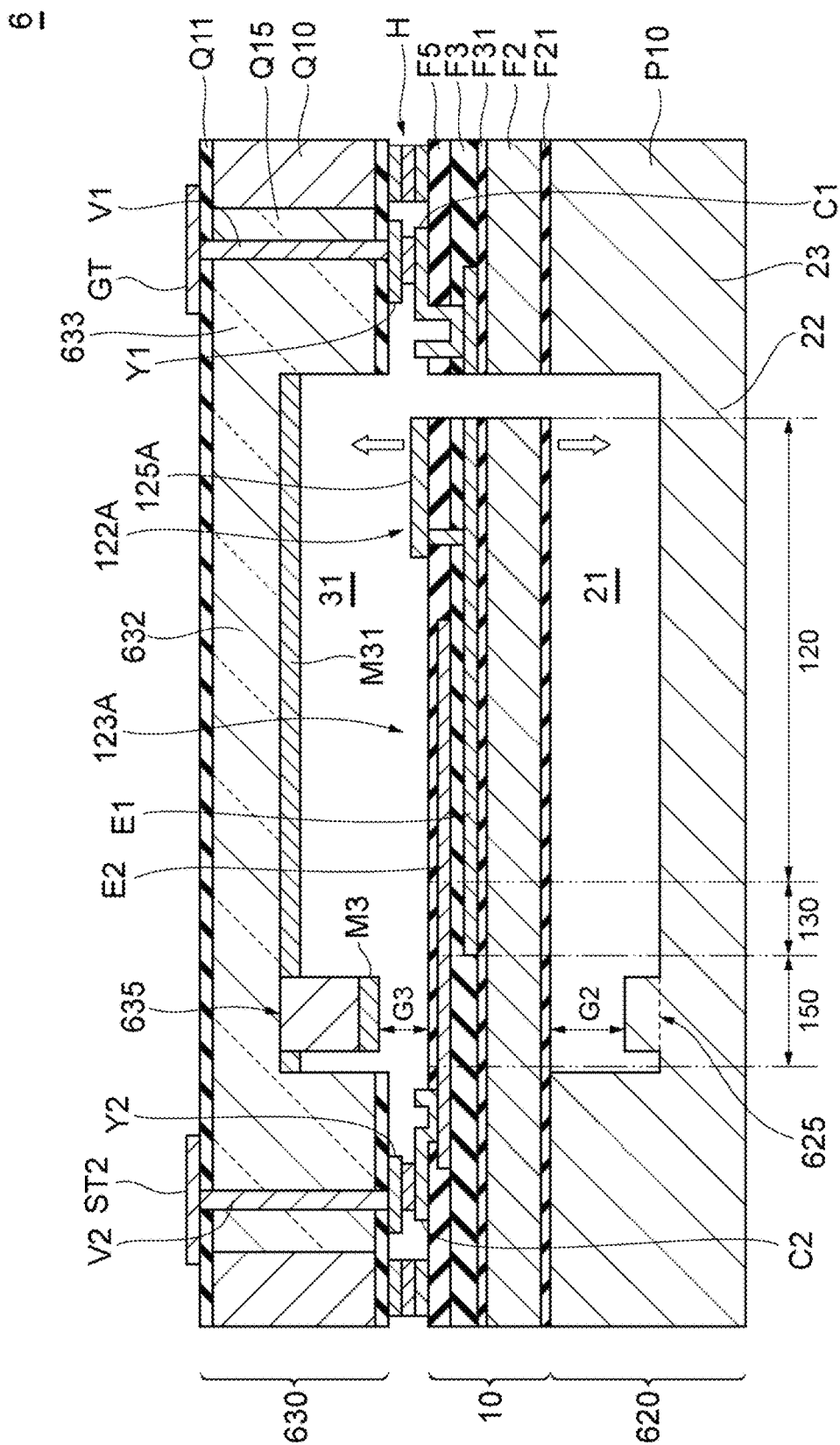
FIG. 10 is a sectional view of a resonance device according to a sixth exemplary embodiment.

Next, a structure of a resonance device 6 according to a sixth exemplary embodiment is described with reference to FIG. 10. FIG. 10 is a sectional view of the resonance device according to the sixth exemplary embodiment.

The distance G3 between a limiting part 635 of an upper cover 630 and the resonator 10 in the thickness direction is smaller than the distance G2 between a limiting part 625 of a lower cover 620 and the resonator 10 in the thickness direction. An entire bottom plate 632 is provided by the glass substrate Q15, and a circumference of the through-electrodes V1 and V2 of a side wall 633 is provided by the glass substrate Q15. In the upper cover 630, a surface of the bottom plate 632 facing the resonator 10 is provided with the metal film M31.

Therefore, an inner surface of the bottom plate 632, which is provided by the insulating glass substrate Q15, is covered by the conductive metal film M31. Thereby, occurrence of charge-up of the bottom plate 632 is suppressed.

Seventh Exemplary Embodiment

Figure 11:
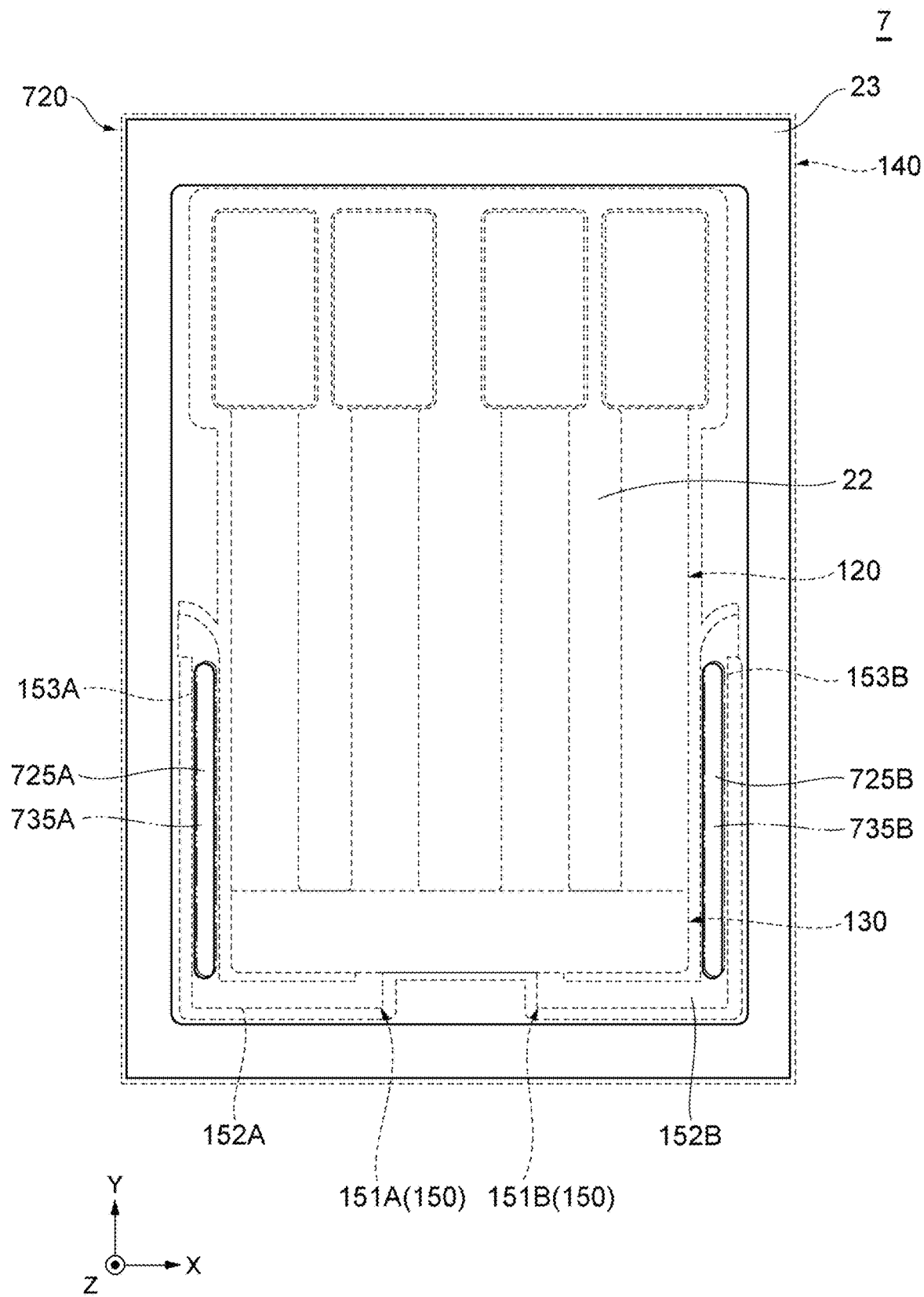
FIG. 11 is a plan view of an internal portion of a resonance device according to a seventh exemplary embodiment.

Next, a structure of a resonance device 7 according to a seventh exemplary embodiment is described with reference to FIG. 11. FIG. 11 is a plan view of an internal portion of the resonance device according to the seventh exemplary embodiment.

A lower cover 720 includes two limiting parts 725A and 725B. The limiting part 725A is opposed to the support side arm 153A of the left supporting arm 151A of the supporting arm 150 in the thickness direction. The limiting part 725B is opposed to the support side arm 153B of the right supporting arm 151B of the supporting arm 150 in the thickness direction. The limiting parts 725A and 725B are each provided to have a strip shape where a longitudinal direction is the Y-axis direction in plan view. An upper cover similarly includes two limiting parts 735A and 735B. The limiting part 735A is opposed to the limiting part 725A in the thickness direction, and the limiting part 735B is opposed to the limiting part 725B in the thickness direction.

Therefore, displacement of the supporting arm 150 is limited at a part closer to the holding part 140 than the support back arms 152A and 152B. Thereby, damage of the supporting arm 150 can further effectively be suppressed.

In this manner, each of the lower cover and the upper cover can include two or more limiting parts. Note that the number of limiting parts of the lower cover can be different from the number of limiting parts of the upper cover.

Eighth Exemplary Embodiment

Figure 12:
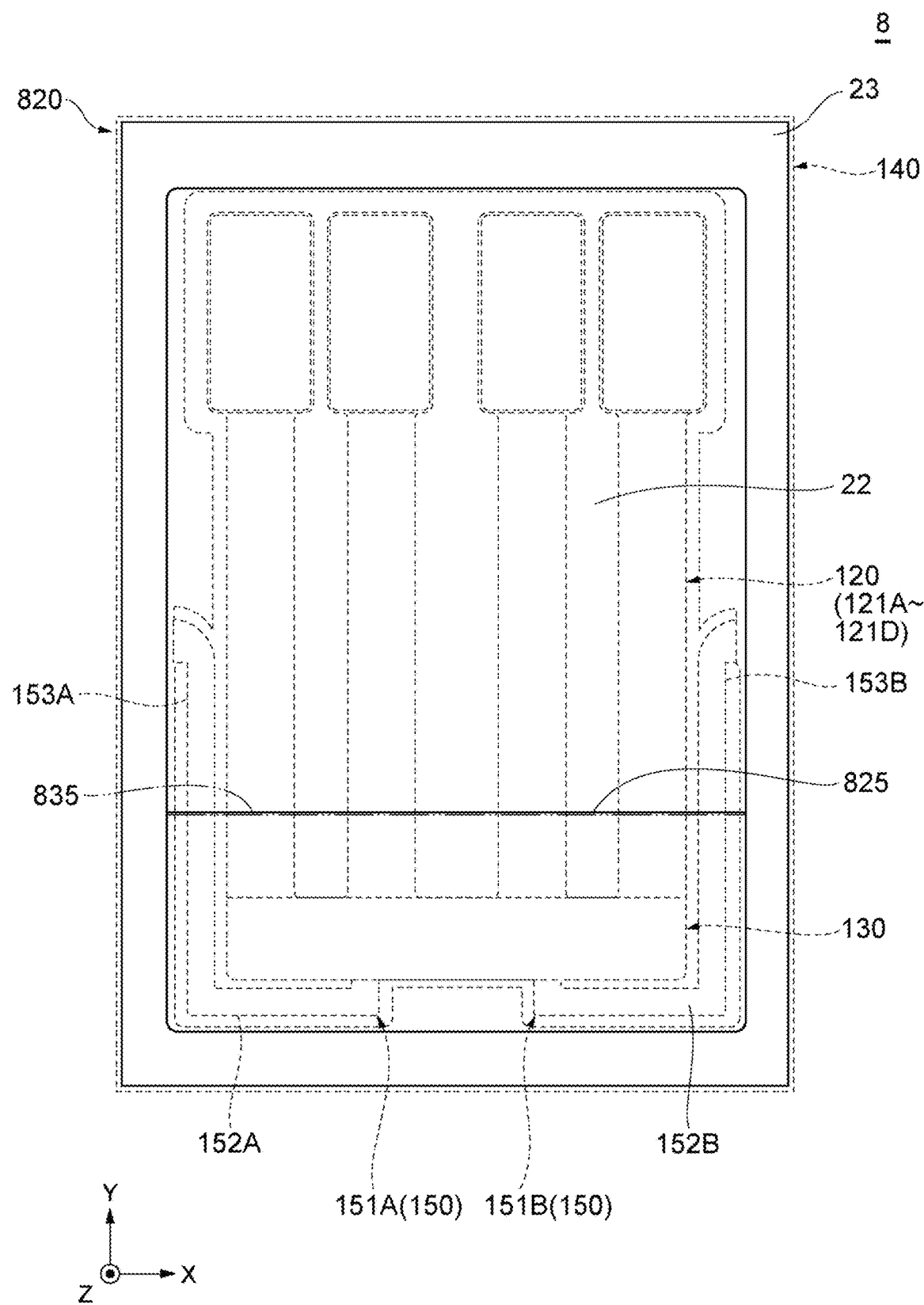
FIG. 12 is a plan view of an internal portion of a resonance device according to an eighth exemplary embodiment.

Next, a structure of a resonance device 8 according to an eighth exemplary embodiment is described with reference to FIG. 12. FIG. 12 is a plan view of an internal portion of the resonance device according to the eighth exemplary embodiment.

A limiting part 825 of a lower cover 820 is opposed to the supporting arm 150, the base part 130, and the excitation part 120 in the thickness direction. In an exemplary aspect, the limiting part 825 is opposed to the entire support back arms 152A and 152B, opposed to a part of the support side arms 153A and 153B, the part being at a side connected to the support back arms 152A and 152B, opposed to the entire base part 130, and opposed to a part of the vibration arms 121A to 121D, the part being at the fixed end side. The limiting part 825 is connected to, in the side wall 23 formed in a frame shape, the entire frame body at the Y-axis negative direction side, a part of the frame body at the X-axis positive direction side, and a part of the frame body at the X-axis negative direction side. The limiting part 825 is provided to have a strip shape where a longitudinal direction is the X-axis direction in plan view. A limiting part 835 of an upper cover is provided in a similar manner.

Therefore, tip-end parts of the limiting parts 825 and 835 can have increased areas. Thereby, a vibration space of the resonance device 8 can have improved degree of vacuum by an increase in the volume of a getter.

In this manner, a position of the limiting part is not limited to the position opposed to the supporting arm in the thickness direction, but can be the position opposed to the vibration part. The limiting part can be opposed to a part of the vibration arm at the open-end side in the thickness direction, or can be opposed to the entire vibration arm.

Ninth Exemplary Embodiment

Figure 13:
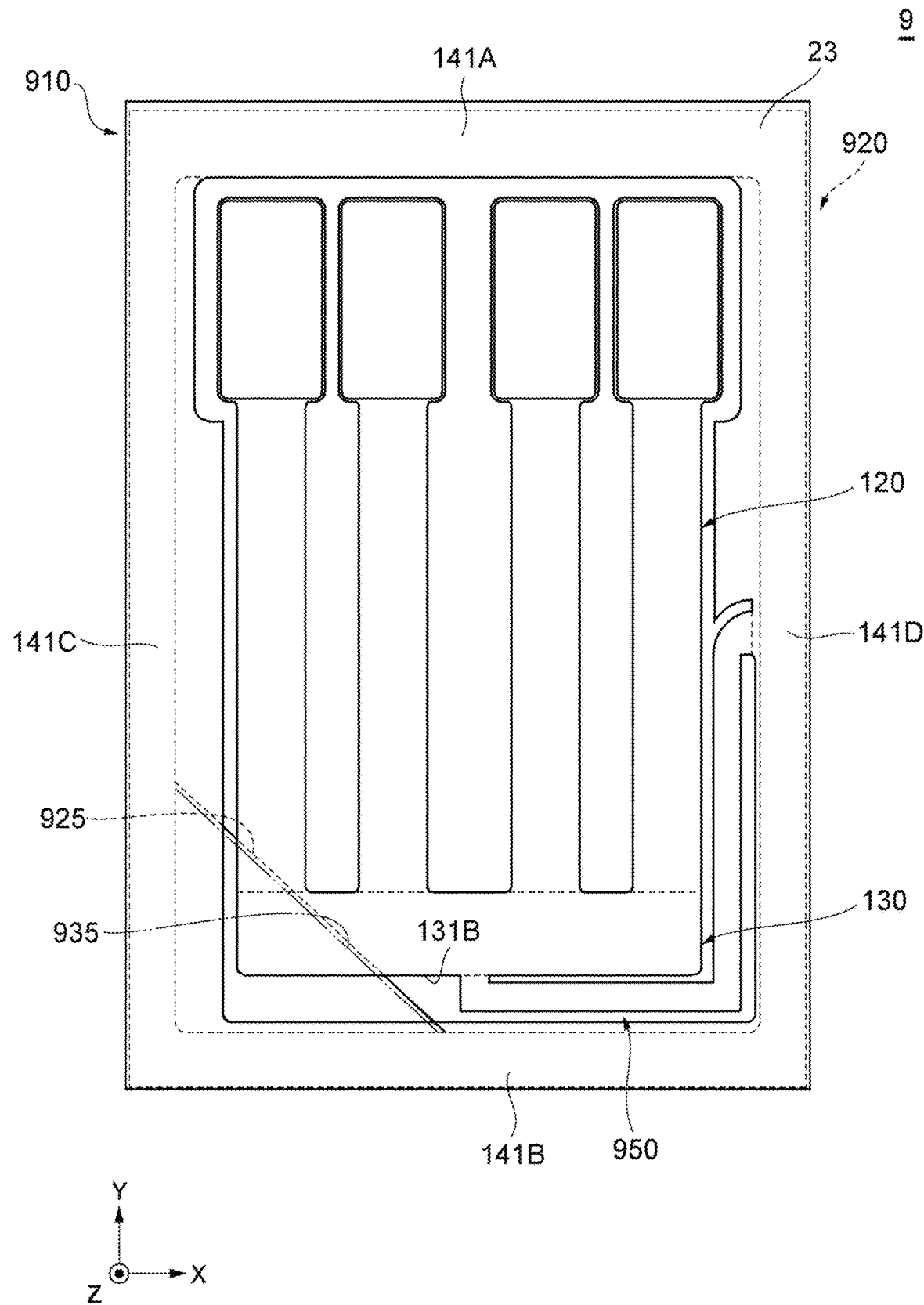
FIG. 13 is a plan view of an internal portion of a resonance device according to a ninth exemplary embodiment.

Next, a structure of a resonance device 9 according to a ninth exemplary embodiment is described with reference to FIG. 13. FIG. 13 is a plan view of an internal portion of the resonance device according to the ninth exemplary embodiment.

In a resonator 910, the base part 130 is supported by a single supporting arm 950. The supporting arm 950 connects the back-end part 131B of the base part 130 and the right frame 141D of the holding part 140. In an exemplary aspect, the supporting arm 950 extends from a center part in the X-axis direction of the back-end part 131B toward the back frame 141B, then is bent to extend toward the right frame 141D, then is bent to extend toward the front frame 141A, and then is bent to extend toward the right frame 141D.

A limiting part 925 of a lower cover 920 is opposed to the excitation part 120 and the base part 130 in the thickness direction. Moreover, the limiting part 925 is apart from the supporting arm 950 in plan view. The limiting part 925 is connected to, in the side wall 23 formed in a frame shape, a part of the frame body at the X-axis negative direction side, and a part of the frame body at the Y-axis negative direction side. The limiting part 925 is provided to have a triangular shape in plan view. A limiting part 935 of an upper cover is provided in a similar manner.

Therefore, the limiting parts 925 and 935 can brought in contact with the excitation part 120 and the base part 130 that have mechanical strength higher than that of the supporting arm 950. Thereby, damage of the resonator 910 attributed to contact with the supporting arm 950 is suppressed.

Tenth Exemplary Embodiment

Figure 14:
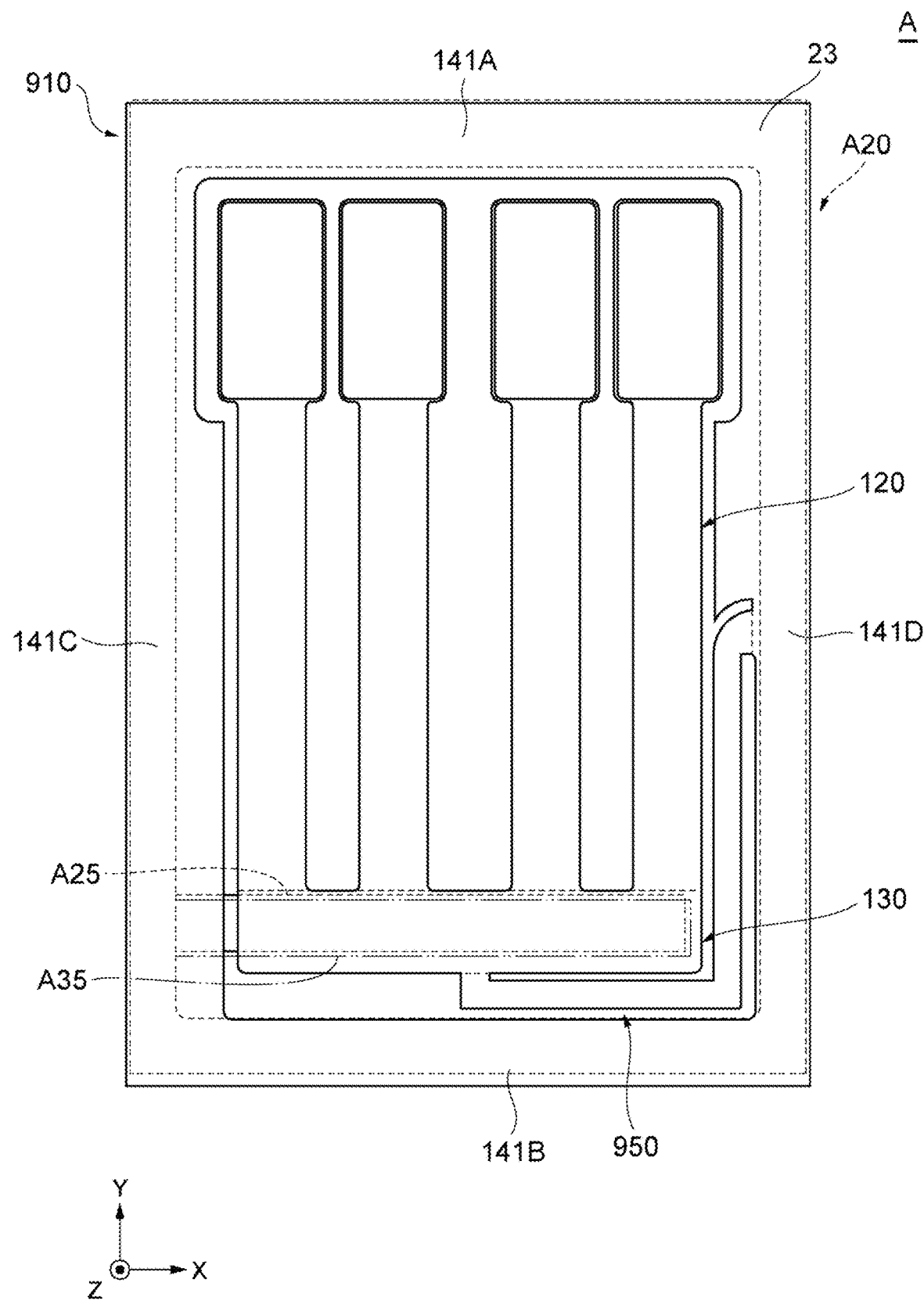
FIG. 14 is a plan view of an internal portion of a resonance device according to a tenth exemplary embodiment.

Next, a structure of a resonance device A according to a tenth exemplary embodiment is described with reference to FIG. 14. FIG. 14 is a plan view of an internal portion of the resonance device according to the tenth exemplary embodiment.

A limiting part A25 of a lower cover A20 is opposed to the base part 130 in the thickness direction. The limiting part A25 is adjacent to the four vibration arms in the Y-axis direction. Moreover, the limiting part A25 is apart from the excitation part 120 and the supporting arm 950 in plan view. The limiting part A25 is connected to, in the side wall 23 provided in a frame shape, a part of the frame body at the X-axis negative direction side. The limiting part A25 is provided to have a strip shape where a longitudinal direction is the X-axis direction in plan view. A limiting part A35 of an upper cover is provided in a similar manner.

Therefore, the limiting parts A25 and A35 can brought in contact with the base part 130 with high mechanical strength. Thereby, damage of the resonator 910 attributed to contact with the supporting arm 950 is suppressed.

A part or the whole of the exemplary embodiments of the present disclosure are appended below. Note that the present disclosure is not limited to the following additional notes.

<1> A resonance device including: a resonator including a vibration part, a holding part disposed at at least a part of a circumference of the vibration part, and a supporting arm connecting the vibration part and the holding part; and a first substrate including a first bottom plate provided in such a manner as to have a gap with respect to the vibration part in a thickness direction, a first side wall extending from a circumferential edge part of the first bottom plate toward the holding part, and a first limiting part having a distance to the resonator in the thickness direction smaller than a distance between the resonator and the first bottom plate, in which a first metal film that is configured to function as a getter is provided to a tip-end part of the first limiting part, the tip-end part facing the resonator in the thickness direction.

<2> The resonance device according to <1>, further including: a second substrate including a second bottom plate provided in such a manner as to have a gap with respect to the vibration part in the thickness direction, a second side wall extending from a circumferential edge part of the second bottom plate toward the holding part, and a second limiting part having a distance to the resonator in the thickness direction smaller than a distance between the resonator and the second bottom plate, in which a second metal film that is configured to function as a getter is provided to a tip-end part of the second limiting part, the tip-end part facing the resonator in the thickness direction.

<3> The resonance device according to <1>, further including: a second substrate including a second bottom plate provided in such a manner as to have a gap with respect to the vibration part in the thickness direction, a second side wall extending from a circumferential edge part of the second bottom plate toward the holding part, and a second limiting part having a distance to the vibration part in the thickness direction smaller than a distance between the vibration part and the second bottom plate, in which a distance between the second limiting part and the resonator in the thickness direction is larger than a distance between the first limiting part and the resonator in the thickness direction, and a tip-end part of the second limiting part is made of silicon or a silicon compound, the tip-end part facing the resonator in the thickness direction.

<4> The resonance device according to any one of <1> to <3>, in which the first metal film is further provided to the first bottom plate.

<5> The resonance device according to <2>, in which the second metal film is further provided to the second bottom plate.

<6> The resonance device according to any one of <1> to <5>, in which the first substrate includes an inner terminal electrically connected to the resonator, an outer terminal electrically connected to an external substrate, and a through-electrode electrically connecting the inner terminal and the outer terminal, and a portion surrounding a circumference of the through-electrode is made of glass including a silicon oxide as a main component.

<7> The resonance device according to any one of <1> to <6>, in which the first substrate includes an inner terminal electrically connected to the resonator, an outer terminal electrically connected to an external substrate, and a through-electrode electrically connecting the inner terminal and the outer terminal, and the first bottom plate is made of glass including a silicon oxide as a main component.

<8> The resonance device according to any one of <1> to <7>, in which the first limiting part is opposed to the supporting arm in the thickness direction.

<9> The resonance device according to any one of <1> to <8>, in which the first metal film is made of titanium or zirconium.

<10> The resonance device according to any one of <1> to <8>, in which the first metal film is made of a metal with a bulk modulus lower than a bulk modulus of gold.

The exemplary embodiments according to the present disclosure are suitably applicable without particular limitation as long as they are applied to a device that utilizes frequency characteristics of a vibrator, such as a timing device, a sound emitter, an oscillator, a load sensor, and the like.

As described above, according to one exemplary aspect of the present disclosure, a resonance device that can suppress frequency fluctuation is provided.

Note that the exemplary embodiments described above are intended to facilitate understanding of the present disclosure and are not intended to be construed as limiting the present disclosure. The present disclosure can be changed/modified without departing from the spirit of the present disclosure, and equivalents thereof are also included in the present disclosure. That is, those in which design changes are appropriately made to each exemplary embodiment by those skilled in the art are also included in the scope of the present disclosure as long as they have the features of the present disclosure. For example, the elements included in each exemplary embodiment and arrangements, materials, conditions, shapes, sizes, and the like thereof are not limited to those exemplified and can be appropriately changed. Further, the elements included in each exemplary embodiment can be combined as much as technically possible, and combinations of these are also included in the scope of the present disclosure as long as they include the features of the present disclosure.

REFERENCE SIGNS LIST 1 resonance device
10 resonator
20 lower cover
30 upper cover
21, 31 cavity
22, 32 bottom plate
23, 33 side wall
25, 35 limiting part
M2, M3 metal film
50 MEMS substrate
110 vibration part
120 excitation part
121A to 121D vibration arm
130 base part
140 holding part
150 supporting arm

What is claimed is:

1. A resonance device comprising:
a resonator including:
a vibration part,
a frame disposed at at least a portion of a circumference of the vibration part, and
a supporting arm that connects the vibration part to the frame; and
a first substrate including:
a first bottom plate configured to have a first gap from the vibration part in a thickness direction,
a first side wall extending from a circumferential edge of the first bottom plate toward the frame, and
a first limiting part having a first distance to the resonator in the thickness direction that is smaller than a second distance between the resonator and the first bottom plate,
wherein the first limiting part is configured to have a first tip-end with a first metal film facing the resonator in the thickness direction, the first metal film being configured as a first getter that maintains a vacuum of a vibration space in the resonance device.

2. The resonance device according to claim 1, further comprising:
a second substrate including:
a second bottom plate configured to have a second gap from the vibration part in the thickness direction,
a second side wall extending from a circumferential edge of the second bottom plate toward the frame, and
a second limiting part having a third distance to the resonator in the thickness direction that is smaller than a fourth distance between the resonator and the second bottom plate,
wherein the second limiting part is configured to have a second tip-end with a second metal film facing the resonator in the thickness direction, the second metal film being configured as a second getter that maintains the vacuum of the vibration space.

3. The resonance device according to claim 1, further comprising:
a second substrate including:
a second bottom plate configured to have a second gap from the vibration part in the thickness direction,
a second side wall extending from a circumferential edge of the second bottom plate toward the frame, and
a second limiting part having a third distance to the vibration part in the thickness direction that is smaller than a fourth distance between the vibration part and the second bottom plate,
wherein the third distance is larger than the first distance, and the second limiting part includes a second tip-end comprising at least one of silicon and a silicon compound and that faces the resonator in the thickness direction.

4. The resonance device according to claim 1, wherein the first bottom plate includes the first metal film.

5. The resonance device according to claim 2, wherein the second bottom plate includes the second metal film.

6. The resonance device according to claim 1, wherein the first substrate includes:
an inner terminal configured to be electrically connected to the resonator,
an outer terminal configured to be electrically connected to an external substrate, and
a through-electrode configured to electrically connect the inner terminal to the outer terminal; and
wherein a portion surrounding a circumference of the through-electrode and that comprises a glass that includes a silicon oxide as a main component.

7. The resonance device according to claim 1, wherein the first substrate includes:
an inner terminal configured to be electrically connected to the resonator,
an outer terminal configured to be electrically connected to an external substrate, and a through-electrode configured to electrically connect the inner terminal to the outer terminal; and wherein the first bottom plate comprises a glass that includes a silicon oxide as a main component.

8. The resonance device according to claim 1, wherein the first limiting part is opposed to the supporting arm in the thickness direction.

9. The resonance device according to claim 1, wherein the first metal film comprises at least one of titanium and zirconium.

10. The resonance device according to claim 1, wherein the first metal film comprises a metal with a bulk modulus lower than a bulk modulus of gold.

11. The resonance device according to claim 1, wherein the first limiting part comprises a glass including silicon or a silicon oxide as a main component.

12. The resonance device according to claim 1, wherein the first bottom plate and the first limiting part are formed integrally using a same material.

13. A resonance device comprising:
 a resonator configured to be joined with a first cover and a second cover to form a vibration space, the resonator comprising a vibration part configured to vibrate in the vibration space,
 wherein the first cover comprises:
  a first bottom plate configured to have a first gap from the vibration part in a thickness direction, and
  a first limiting part having a first distance to the resonator in the thickness direction that is smaller than a second distance between the resonator and the first bottom plate, the first limiting part having a first tip-end with a first metal film facing the resonator in the thickness direction, the first metal film being configured as a first getter that maintains a vacuum of the vibration space.

14. The resonance device according to claim 13, wherein the second cover comprises:

a second bottom plate configured to have a second gap to the vibration part in the thickness direction; and
 a second limiting part having a third distance to the resonator in the thickness direction that is smaller than a fourth distance between the resonator and the second bottom plate,
 wherein the second limiting part has a second tip-end with a second metal film facing the resonator in the thickness direction, the second metal film being configured as a second getter that maintains the vacuum of the vibration space.

15. The resonance device according to claim 13, wherein the second cover comprises:
 a second bottom plate configured to have a second gap from the vibration part in the thickness direction; and
 a second limiting part having a third distance to the vibration part in the thickness direction that is smaller than a fourth distance between the vibration part and the second bottom plate, the third distance being larger than the first distance, and the second limiting part having a second tip-end including at least one of silicon and a silicon compound and that faces the resonator in the thickness direction.

16. The resonance device according to claim 13, wherein the first bottom plate includes the first metal film.

17. The resonance device according to claim 14, wherein the second bottom plate includes the second metal film.

18. The resonance device according to claim 13, wherein the first limiting part is opposed to a supporting arm connected to the vibration part in the thickness direction.

19. The resonance device according to claim 13, wherein the first metal film comprises at least one of titanium and zirconium.

20. The resonance device according to claim 13, wherein the first metal film comprises a metal with a bulk modulus lower than a bulk modulus of gold.

* * * * *